United States Patent
Li et al.

(10) Patent No.: US 11,192,823 B2
(45) Date of Patent: Dec. 7, 2021

(54) ELECTRONIC DEVICES INCLUDING LASER-TEXTURED GLASS COVER MEMBERS

(71) Applicant: Apple Inc., Cupertino, CA (US)

(72) Inventors: Michael M. Li, San Jose, CA (US); Jairam Manjunathaiah, Cupertino, CA (US); Palaniappan Chinnakaruppan, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/564,568

(22) Filed: Sep. 9, 2019

(65) Prior Publication Data
US 2020/0385307 A1 Dec. 10, 2020

Related U.S. Application Data

(60) Provisional application No. 62/857,634, filed on Jun. 5, 2019.

(51) Int. Cl.
| | |
|---|---|
| *G06F 1/16* | (2006.01) |
| *H05K 5/00* | (2006.01) |
| *H05K 5/03* | (2006.01) |
| *H04B 1/03* | (2006.01) |
| *H04B 1/08* | (2006.01) |
| *G02B 1/11* | (2015.01) |
| *G02B 5/02* | (2006.01) |
| *H04M 1/02* | (2006.01) |

(Continued)

(52) U.S. Cl.
CPC .......... *C03C 23/0025* (2013.01); *C03C 15/00* (2013.01); *C03C 21/002* (2013.01); *G02B 1/12* (2013.01); *G06F 1/1616* (2013.01); *H04M 1/026* (2013.01); *H05K 5/0017* (2013.01); *H05K 5/03* (2013.01)

(58) Field of Classification Search
None
See application file for complete search history.

(56) References Cited

U.S. PATENT DOCUMENTS

| | | | |
|---|---|---|---|
| 4,633,323 A | 12/1986 | Haberkern et al. | |
| 6,068,891 A | 5/2000 | O'Dell et al. | |

(Continued)

FOREIGN PATENT DOCUMENTS

| | | |
|---|---|---|
| CN | 203013800 | 6/2013 |
| CN | 203406929 | 1/2014 |

(Continued)

OTHER PUBLICATIONS

Author Unknown, "LG's Future Display Technology Will Blow You Away," Techno Source, https://www.youtube.com/watch?v=qlRjytgNuhM, 2 pages, May 2, 2017.

(Continued)

*Primary Examiner* — Tuan A Tran
(74) *Attorney, Agent, or Firm* — Brownstein Hyatt Farber Schreck, LLP

(57) ABSTRACT

A laser-textured glass cover member suitable for use in an electronic device is disclosed. The laser-textured surface of the glass cover member may provide a smooth feel to an external surface of the electronic device without introducing a perceptible visual texture. Methods for making the laser-textured glass cover members are also disclosed.

12 Claims, 14 Drawing Sheets

(51) Int. Cl.
  *C03C 23/00* (2006.01)
  *G02B 1/12* (2006.01)
  *C03C 21/00* (2006.01)
  *C03C 15/00* (2006.01)

(56) References Cited

U.S. PATENT DOCUMENTS

| | | | |
|---|---|---|---|
| 6,677,703 B2* | 1/2004 | Ito | G02F 1/133502 |
| | | | 313/478 |
| 7,297,386 B2* | 11/2007 | Suzuki | B29C 59/02 |
| | | | 428/141 |
| 7,646,143 B2* | 1/2010 | Kimura | H01L 51/5268 |
| | | | 313/501 |
| 8,092,911 B2 | 1/2012 | Sakoske et al. | |
| 8,106,787 B2 | 1/2012 | Nurmi | |
| 8,213,085 B2* | 7/2012 | Liu | H01L 27/14625 |
| | | | 359/586 |
| 8,553,333 B2* | 10/2013 | Chang | C23C 18/1216 |
| | | | 359/619 |
| 8,576,561 B2 | 11/2013 | Myers et al. | |
| 8,603,372 B2* | 12/2013 | Tanaka | C03C 1/008 |
| | | | 264/2.6 |
| 8,681,113 B1 | 3/2014 | Wu et al. | |
| 8,771,532 B2 | 7/2014 | Carlson et al. | |
| 8,872,295 B2* | 10/2014 | Hermans | H01L 31/0236 |
| | | | 257/432 |
| 8,896,802 B2 | 11/2014 | Yoneyama et al. | |
| 8,953,083 B2 | 2/2015 | Hedge | |
| 9,017,566 B2 | 4/2015 | Lander et al. | |
| 9,034,166 B2 | 5/2015 | Tatebe et al. | |
| 9,154,678 B2 | 10/2015 | Kwong et al. | |
| 9,239,594 B2 | 1/2016 | Lee et al. | |
| 9,240,498 B2 | 1/2016 | Fujita et al. | |
| 9,262,002 B2 | 2/2016 | Momeyer et al. | |
| 9,377,603 B1 | 6/2016 | Cheng et al. | |
| 9,448,713 B2 | 9/2016 | Cruz-Hernandez et al. | |
| 9,644,281 B2 | 5/2017 | Tatebe et al. | |
| 9,658,500 B2 | 5/2017 | Iwamoto | |
| 9,732,237 B2 | 8/2017 | Sugamoto et al. | |
| 9,745,221 B2 | 8/2017 | Ehrensperger et al. | |
| 9,862,124 B2* | 1/2018 | Radcliffe | C09J 7/20 |
| 9,880,327 B2 | 1/2018 | Park et al. | |
| 9,938,186 B2 | 4/2018 | Moll et al. | |
| 9,961,337 B2 | 5/2018 | Stroetmann | |
| 10,013,020 B2 | 7/2018 | Hong et al. | |
| 10,043,052 B2 | 8/2018 | Wickboldt et al. | |
| 10,171,636 B2 | 1/2019 | Yeo et al. | |
| 10,214,445 B2* | 2/2019 | Hart | C09D 1/02 |
| 10,298,824 B2 | 5/2019 | Lee et al. | |
| 10,442,151 B2 | 10/2019 | Ozeki et al. | |
| 10,647,032 B2* | 5/2020 | Radcliffe | B29D 11/0073 |
| 10,676,393 B2* | 6/2020 | Weber | B32B 17/06 |
| 10,827,635 B1 | 11/2020 | Limarga et al. | |
| 10,866,616 B2* | 12/2020 | Seo | G06F 3/0412 |
| 10,948,633 B2 | 3/2021 | Murakami et al. | |
| 2002/0127565 A1* | 9/2002 | Cunningham | G01N 21/7743 |
| | | | 435/6.19 |
| 2003/0011315 A1* | 1/2003 | Ito | G02B 1/118 |
| | | | 315/169.3 |
| 2005/0266250 A1 | 12/2005 | Hayakawa | |
| 2006/0024508 A1 | 2/2006 | D'Urso et al. | |
| 2006/0034042 A1 | 2/2006 | Hisano et al. | |
| 2007/0195419 A1* | 8/2007 | Tsuda | C03C 17/007 |
| | | | 359/601 |
| 2009/0257207 A1 | 10/2009 | Wang et al. | |
| 2012/0127755 A1 | 5/2012 | Shiau et al. | |
| 2012/0194974 A1* | 8/2012 | Weber | C03C 21/002 |
| | | | 361/679.01 |
| 2012/0218640 A1 | 8/2012 | Gollier et al. | |
| 2012/0274565 A1 | 11/2012 | Moser et al. | |
| 2013/0026593 A1* | 1/2013 | Hermans | H01L 31/046 |
| | | | 257/432 |
| 2013/0235462 A1 | 9/2013 | Haas | |
| 2013/0273324 A1 | 10/2013 | Moll et al. | |
| 2014/0035869 A1 | 2/2014 | Yun et al. | |
| 2014/0063609 A1 | 3/2014 | Iwata et al. | |
| 2014/0098075 A1 | 4/2014 | Kwak et al. | |
| 2014/0106127 A1 | 4/2014 | Lyons et al. | |
| 2014/0327643 A1 | 11/2014 | Sun et al. | |
| 2015/0090689 A1 | 4/2015 | Guilfoyle et al. | |
| 2016/0224822 A1 | 8/2016 | Hasegawa et al. | |
| 2016/0283014 A1 | 9/2016 | Rider et al. | |
| 2017/0026553 A1 | 1/2017 | Lee et al. | |
| 2017/0058130 A1 | 3/2017 | Addleman et al. | |
| 2017/0276618 A1 | 9/2017 | Takagi | |
| 2017/0308234 A1 | 10/2017 | Li et al. | |
| 2018/0042131 A1 | 2/2018 | Liu et al. | |
| 2018/0086662 A1 | 3/2018 | Luzzato et al. | |
| 2018/0162091 A1 | 6/2018 | Takeda et al. | |
| 2018/0162768 A1 | 6/2018 | Boek et al. | |
| 2018/0215657 A1* | 8/2018 | Jin | C03C 17/22 |
| 2018/0282201 A1 | 10/2018 | Hancock et al. | |
| 2019/0032237 A1 | 1/2019 | Kim et al. | |
| 2019/0037690 A1 | 1/2019 | Wilson et al. | |
| 2019/0155339 A1 | 5/2019 | Fenton et al. | |
| 2019/0230204 A1 | 7/2019 | Zhang | |
| 2019/0236887 A1 | 8/2019 | Rich et al. | |
| 2019/0241455 A1 | 8/2019 | Sweney et al. | |
| 2019/0246018 A1 | 8/2019 | Rho et al. | |
| 2019/0331940 A1 | 10/2019 | Poole et al. | |
| 2020/0014780 A1 | 1/2020 | Jones | |
| 2020/0026327 A1 | 1/2020 | Hendren et al. | |
| 2020/0189966 A1 | 6/2020 | Lee et al. | |
| 2020/0199020 A1 | 6/2020 | Hatano et al. | |
| 2020/0301527 A1 | 9/2020 | Poole et al. | |
| 2020/0304616 A1 | 9/2020 | Jones | |
| 2020/0379143 A1* | 12/2020 | Gu | H05K 5/03 |
| 2020/0389991 A1 | 12/2020 | Shannon et al. | |
| 2021/0014992 A1 | 1/2021 | Limarga et al. | |

FOREIGN PATENT DOCUMENTS

| | | |
|---|---|---|
| CN | 207070526 | 3/2018 |
| CN | 107911964 | 4/2018 |
| CN | 207992872 | 10/2018 |
| CN | 208433428 | 1/2019 |
| CN | 208461858 | 2/2019 |
| CN | 109640557 | 4/2019 |
| DE | 10223165 | 12/2003 |
| EP | 3454541 | 3/2019 |
| JP | 2011510904 | 4/2011 |
| JP | 2013242725 | 12/2013 |
| JP | 2016045824 | 4/2016 |
| JP | 2017508178 | 3/2017 |
| JP | 2018506851 | 3/2018 |
| KR | 20130127842 | 11/2013 |
| KR | 20160145081 | 12/2016 |
| TW | 201910882 | 3/2019 |
| WO | WO2014/011328 | 1/2014 |
| WO | WO2014/012003 | 1/2014 |
| WO | WO2015/191949 | 12/2015 |
| WO | WO2019/027675 | 2/2019 |

OTHER PUBLICATIONS

Seth, Radhika, "A Fresh New Look at the Computer," https://www.yankodesign.com/2009/02/06/a-fresh-new-look-at-the-computer, 1 page, Feb. 6, 2009.

Ben-Yakar et al., "Femtosecond laser ablation properties of borosilicate glass," Journal of Applied Physics, vol. 96, No. 9, 8 pages, Nov. 1, 2004.

Hedayati et al., Antireflective Coatings: Conventional Stacking Layers and Ultrathin Plasmonic Metasurfaces, A Mini-Review, Materials, vol. 9, No. 497, 2016.

Qi et al., "Simple Approach to Wafer-Scale Self-Cleaning Antireflective Silicon Surfaces," American Chemical Society, State Key Laboratory of Supramolecular Structure and Materials, College of Chemistry, Jilin University, Changchun 130012, P.R. China, 2009.

Tan et al., "Broadband antireflection film with moth-eye-like structure for flexible display applications," Optica, vol. 4, No. 7, pp. 678-683, Jul. 2017.

(56) References Cited

OTHER PUBLICATIONS

Wimmer, "Curve: Revisiting the Digital Desk," NordiCHI '10: Proceedings of the 6th Nordic Conference on Human-Computer Interaction: Extending Boundaries, https://doi.org/10.1145/1868914.1868977, http://www.mmi.ifi.lmu.de/pubdb/publications/pub/wimmer2010Curve/wimmer2010Curve.pdf, https://dl.acm.org/doi/10.1145/1868914.1868977, pp. 561-570, Oct. 2010.

* cited by examiner

ELECTRONIC DEVICES INCLUDING LASER-TEXTURED GLASS COVER MEMBERS

CROSS-REFERENCE TO RELATED APPLICATION(S)

This application is a nonprovisional patent application of and claims the benefit of U.S. Provisional Patent Application No. 62/857,634, filed Jun. 5, 2019 and titled "Laser-Textured Glass Cover Members," the disclosure of which is hereby incorporated herein by reference in its entirety.

FIELD

The described embodiments relate generally to surface textures for enclosures of electronic devices. More particularly, the present embodiments relate to enclosures including a laser-textured glass cover member, electronic devices including such enclosures, and methods for laser-texturing glass cover members.

BACKGROUND

Enclosures for electronic devices may include a glass cover member. The glass cover member may be provided over a display or a touchpad. In some cases, the glass cover member may be textured to provide particular optical and tactile effects using conventional machining or etching techniques.

SUMMARY

Laser-textured glass components are disclosed herein. A laser-textured surface of a glass component such as a glass cover member may be configured to provide a desired tactile "feel" to an external surface of an electronic device. Further, the laser-textured surface may provide a desired appearance to the external surface of the electronic device.

A laser-textured surface as described herein may comprise laser-formed features configured to provide the desired tactile and optical properties. A glass cover member defining the laser-textured surface may be included in a cover assembly for an electronic device enclosure. Enclosures including laser-textured glass cover members, electronic devices including such enclosures, and methods for laser-texturing glass cover members are also disclosed.

The disclosure provides an electronic device comprising an enclosure at least partially defining an internal volume of the electronic device. The enclosure includes a cover assembly comprising a glass cover member defining an exterior surface and an interior surface. The glass cover member further defines laser-formed features along the exterior surface and resulting from ablation and flow of the glass cover member, the laser-formed features defining peaks having a mean peak curvature ($S_{sc}$) from about 0.1 microns$^{-1}$ to about 1.2 microns$^{-1}$. The cover assembly further comprises a cosmetic or decorative coating disposed along the interior surface and viewable through the glass cover member.

In addition, the disclosure provides an electronic device comprising an enclosure, a display positioned at least partially within the enclosure, a first glass cover member coupled to the enclosure and defining a transparent portion positioned over the display, and a second glass cover member coupled to the enclosure and including a laser-textured surface defining an irregular set of hills and valleys. The irregular set of hills and valleys has a mean peak spacing from about 1 micron to about 15 microns and a root mean square surface height (Sq) from about 0.1 micron to about 1.5 microns.

The disclosure further provides a method comprising forming a laser-textured surface on a glass cover member for an electronic device, including directing a first sequence of laser pulses onto a surface of the glass cover member to produce a set of first exposure areas on the surface of the glass cover member, thereby forming a first surface texture on the surface of the glass cover member. The forming of the laser-textured surface on the glass cover member also includes directing a second sequence of laser pulses onto the surface of the glass cover member to produce a set of second exposure areas on the surface of the glass cover member, at least one of the second exposure areas offset from and overlapping at least one of the first exposure areas, thereby causing a flow of a portion of the surface of the glass cover member and forming a second surface texture, different from the first surface texture, on the surface of the glass cover member.

In some embodiments, each sequence of laser pulses results in ablation of the surface of the glass cover member. At least one of the operations of directing a sequence of laser pulses onto the surface of the glass cover member may result in laser-induced flow of the surface of the glass cover. Therefore, the texture of the glass cover member may be formed by a combination of laser-ablating the surface of the glass cover member and laser-inducing flow of the surface of the glass cover member.

BRIEF DESCRIPTION OF THE DRAWINGS

The disclosure will be readily understood by the following detailed description in conjunction with the accompanying drawings, wherein like reference numerals designate like elements.

Figure 1A:
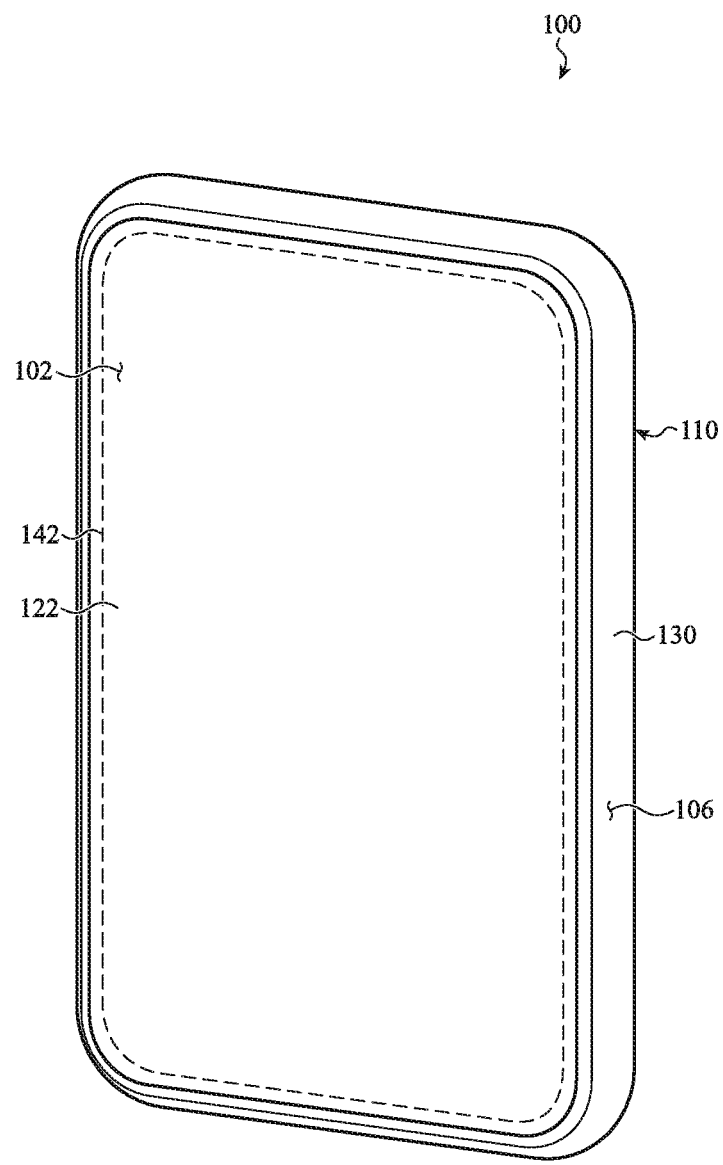
FIG. 1A shows a front view of an example electronic device including a laser-textured glass cover member.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The following disclosure relates to laser-textured glass components such as glass cover members. The laser-textured surfaces of the glass cover members may provide desired tactile, friction, and/or optical properties to an exterior surface of an electronic device. Laser-textured glass cover members may be included in cover assemblies for electronic device enclosures. Enclosures including laser-textured glass cover members and electronic devices including such enclosures are also disclosed herein.

Laser-texturing methods disclosed herein may have advantages as compared to some conventional glass texturing techniques. The laser-texturing methods described herein may produce a more smoothly textured surface than some conventional abrasive etching techniques. For example, laser-textured surfaces may have features that are more rounded than those obtained with some conventional techniques. Textured surfaces with rounded features may provide a smoother feel to the electronic device and may make the textured surface easier to clean. In addition, the laser-texturing methods described herein do not require the acids (e.g., hydrofluoric acid) used in conventional chemical glass etching techniques.

In some embodiments, the laser-textured surface of the glass cover member may be configured to provide a particular coefficient of friction or otherwise may produce a particular tactile feel to a user when the surface is touched. For example, a laser-textured surface may be configured to have a coefficient of friction, for a finger touching or sliding along the laser-textured surface, that is within a specified range, thereby providing a desired feel to the enclosure. A user may touch or slide a finger along the laser-textured surface, for example, as a result of normal handling of a device or to provide an input to the device (such as when the glass cover member defines a touch-sensitive surface or other input surface of the device).

In addition, the laser-textured surface may be configured to impart certain optical properties or appearances to a device, alone or in combination with one or more coatings applied to or otherwise visible through the glass cover member. For example, a cover assembly including a laser-textured glass cover member and a decorative coating may have a desired level of gloss, haziness, transmissivity, or the like, all of which may cooperate to produce a desired visual appearance and/or performance. In addition, the laser-textured surface may not introduce a perceptible visual texture to the corresponding external surface of the enclosure.

The following disclosure also relates to methods for forming laser-textured glass components such as glass cover members. The laser-textured glass cover member may be produced by a method including multiple laser-texturing operations. The texture of the glass cover member may be formed by a combination of laser-ablating the surface of the glass cover member and laser-inducing flow of the surface of the glass cover member. In some embodiments, the texture of the glass cover member after the final laser-texturing operation includes an irregular set of hills and valleys. The number of distinct ablation craters after the final-texturing operation may be fewer than after the first laser-texturing operation.

Each laser-texturing operation directs a sequence of laser pulses onto a surface of the glass cover member. Each sequence of laser pulses produces a set of exposure areas on the surface of the glass cover member. At least one of the exposure areas of a subsequent operation may be offset from and overlapping at least one of the exposure areas of a previous operation. Typically, each sequence of laser pulses results in ablation of the surface of the glass cover member. The multiple laser-texturing operations may result in laser-induced flow of the surface of the glass cover.

The texture produced by the methods described herein can have a random or nearly random appearance. In addition, the texture may not include features, such as raster marks, which indicate the path of the laser beam over the glass cover member. Further, the texture may include features with rounded edges or due to flow and/or melting of the glass material.

These and other embodiments are discussed below with reference to FIGS. 1-11. However, those skilled in the art will readily appreciate that the detailed description given herein with respect to these figures is for explanatory purposes only and should not be construed as limiting.

FIG. 1A shows an example of an electronic device 100 including a laser-textured glass cover member. The electronic device 100 may be a mobile telephone (also referred to as a mobile phone). In additional embodiments, the electronic device 100 may be a notebook computing device (e.g., a notebook), a tablet computing device (e.g., a tablet), a portable media player, a wearable device, or another type of portable electronic device. The electronic device 100 may also be a desktop computer system, computer component, input device, appliance, or virtually any other type of electronic product or device component.

FIG. 1A shows a front view of the electronic device 100. As shown in FIG. 1A, the electronic device 100 has an enclosure 110 including a cover assembly 122. The cover assembly 122 may be attached to a housing member 130.

The enclosure 110 may at least partially surround a display 142 and the cover assembly 122 may be positioned over the display 142. The display 142 may be configured to produce a graphical output that is viewable through the cover assembly 122. For example, the cover assembly 122 may define a transparent window region or window portion through which the graphical output may be viewed. The cover assembly 122 may define a front surface 102, and the housing member 130 may define a side surface 106 of the electronic device. In some cases, the cover assembly 122 may define a front side of the electronic device and may be referred to as a front cover assembly. In this example the cover assembly 122 defines a substantial entirety of the front surface 102 of the electronic device 100.

In some embodiments the cover assembly 122 may be described as a glass cover. However, more generally, a cover assembly, such as the cover assembly 122 and the cover assembly 124, may be formed from multiple layers, and a glass cover member (e.g., glass cover members 123 and 125 shown in FIG. 1C) may form one of the layers of the cover assembly. For example, a multilayer cover assembly may include one or more glass sheets, polymer sheets, and/or various coatings and layers. Typical cover assemblies herein are thin, typically less than 5 mm in thickness, and more typically less than 3 mm in thickness. In some aspects, a glass cover member of a cover assembly can be from about 0.1 mm to 2 mm, from 0.5 mm to 2 mm, or from 0.2 mm to 1 mm in thickness. In some cases, a glass cover member may extend laterally across the cover assembly, such as substantially across the width and the length of the cover assembly. In some cases, the cover assembly (and the glass cover member) may define an opening to allow input or output from a device component such as a camera assembly, a microphone, or other device component.

Figure 1B:
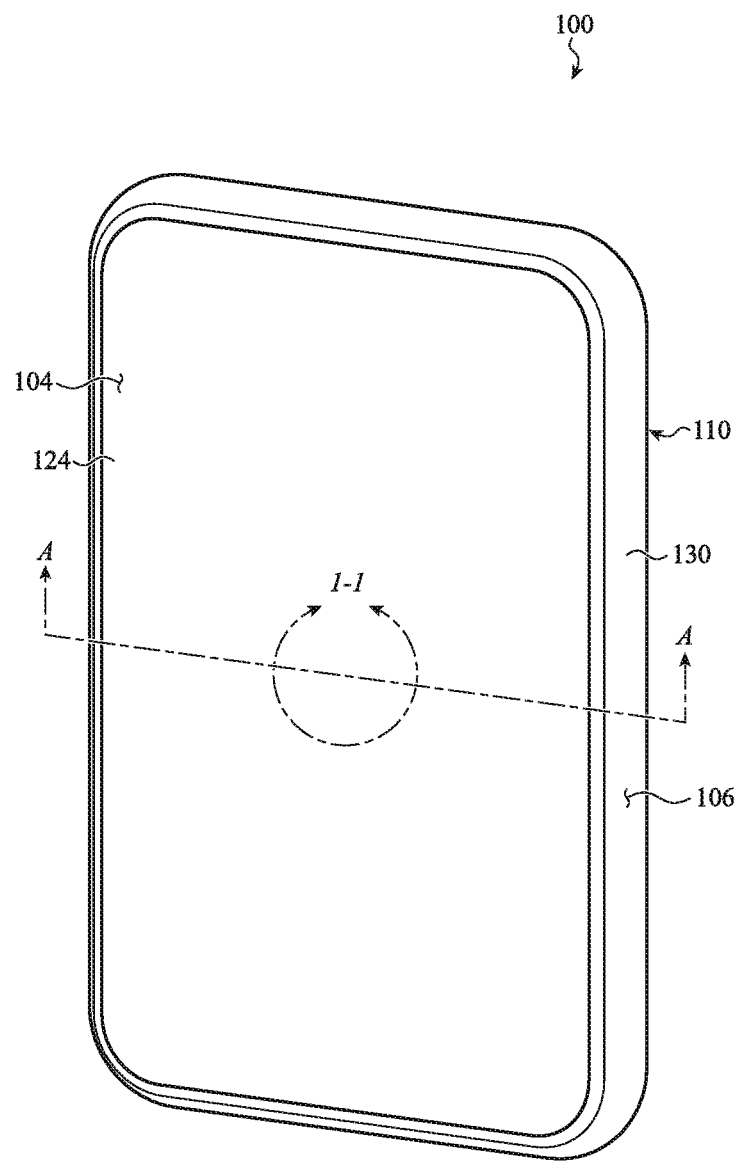
FIG. 1B shows a rear view of the electronic device of FIG. 1A.

FIG. 1B shows a rear view of the electronic device 100 of FIG. 1A. The enclosure 110 further includes a cover assembly 124 affixed to the housing component 130. In some cases, the cover assembly 124 may define a rear side of the electronic device and may be referred to as a rear cover assembly. In this example the cover assembly 124 defines a substantial entirety of the rear surface 104 of the electronic device 100. In the example of FIG. 1B, the cover assembly 124 defines a textured rear surface 104 of the electronic device. The textured rear surface 104 may form a portion or a whole of the rear surface of the electronic device.

As described in further detail with respect to FIGS. 2A-7, the cover assembly 124 may include a glass cover member (e.g., glass cover member 125 shown in FIG. 1C) which defines a laser-textured surface having laser-formed features. The laser-formed features may be perceptible by touch, but not individually perceptible by sight. The laser-formed features may contribute to the feel and/or coefficient of friction to the textured rear surface 104 of the electronic device. In addition, the laser-formed features may contribute to one or more optical properties of the cover assembly 124 and of the textured rear surface 104 of the electronic device. The laser-textured surface of the glass cover member may at least partially define the textured rear surface 104. For example, the textured rear surface 104 may be defined by a combination of the laser-textured surface of the glass cover member and any coatings applied to the laser-textured surface.

Figure 1C:
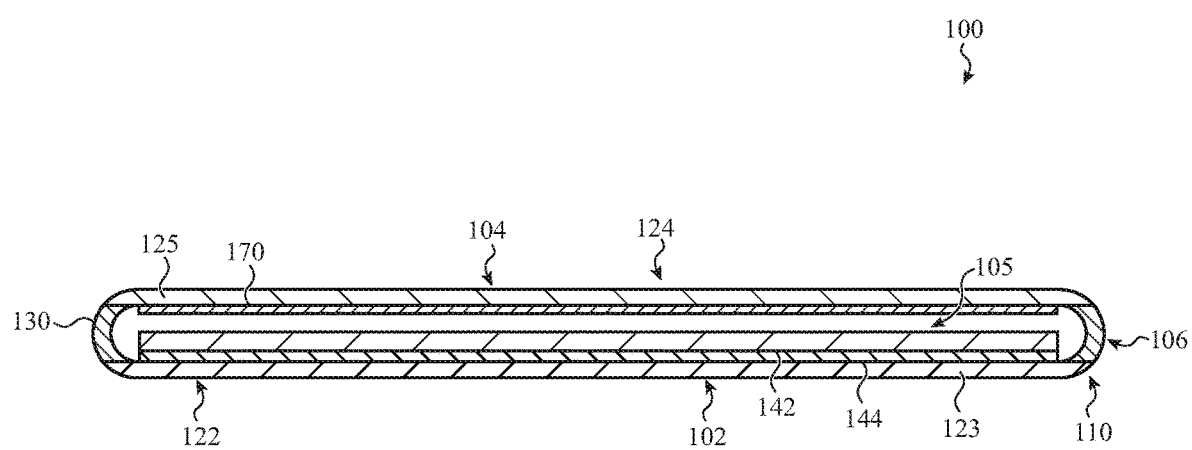
FIG. 1C shows a cross-section view of the electronic device of FIGS. 1A and 1B.

FIG. 1C shows a cross-section view of an embodiment of the electronic device 100 of FIGS. 1A and 1B, such as along A-A. As shown in FIG. 1C, the cover assembly 124 includes a glass cover member 125 and the cover assembly 122 includes a glass cover member 123. A layer 170, such as a cosmetic or decorative layer, is disposed along an interior surface of the cover assembly 124. For example, a decorative layer may include a color layer (e.g., an ink, dye, paint, etc.) and/or a metal layer. In some embodiments, a multilayer decorative coating including at least one decorative layer is disposed along an interior surface of the glass cover member as described in further detail with respect to FIG. 2A. As an additional example, a cosmetic layer may form a masking layer.

Figure 11:
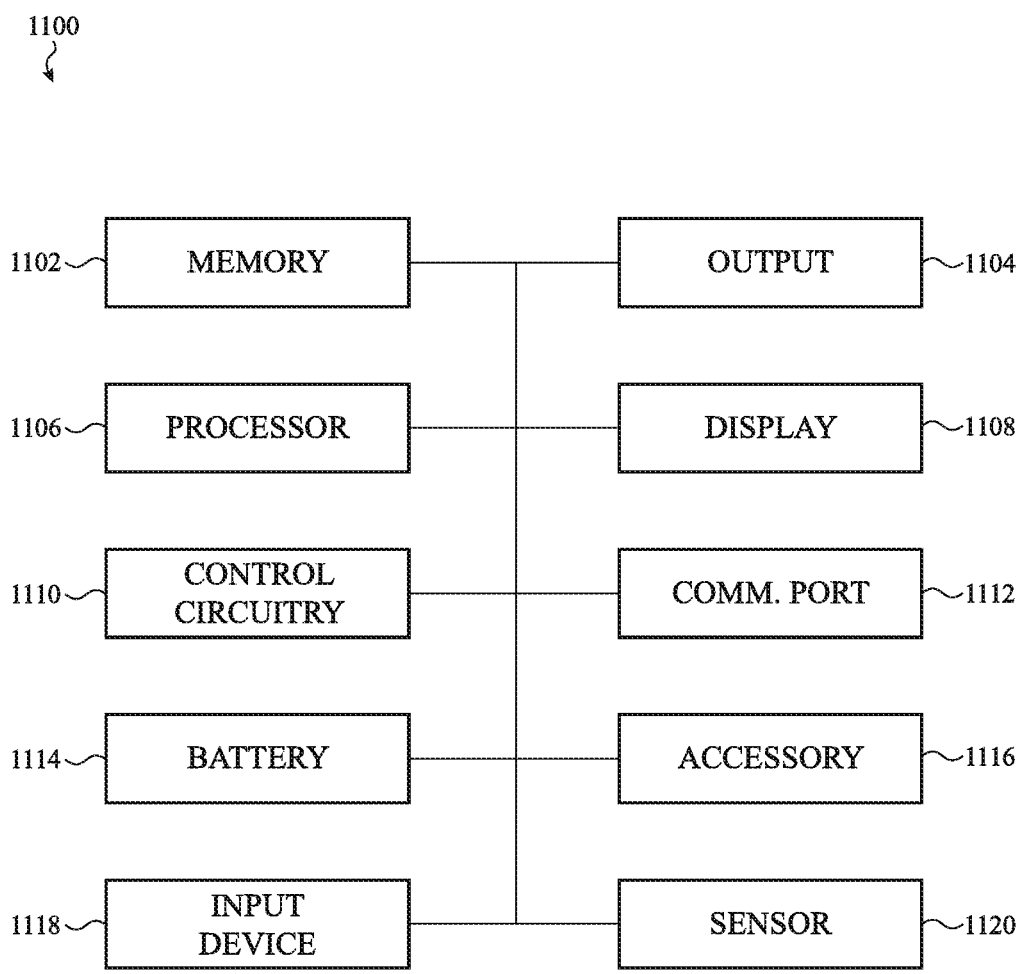
FIG. 11 shows a block diagram of a sample electronic device that can incorporate a glass cover member having a laser-textured surface.

As shown in FIG. 1C, the electronic device 100 includes a touch sensor 144 provided along cover assembly 122 and a display 142 provided along touch sensor 144. Both the touch sensor 144 and the display 142 are positioned within an internal cavity 105 of the electronic device 100. The touch sensor 144 and the display 142 may be coupled to the cover assembly 122 such as with an adhesive and/or a fastener or another form of mechanical attachment. The electronic device will typically include additional components to those shown in FIG. 1C. For example, the electronic device may comprise one or more of a display, a processing unit, control circuitry, memory, an input/output device, a power source (e.g., a battery), a charging assembly (e.g., a wireless charging assembly), a network communication interface, a camera or other accessory, and a sensor. Components of a sample electronic device are discussed in more detail below with respect to FIG. 11. The description provided with respect to FIG. 11 is generally applicable herein and, for brevity, will not be repeated here.

The housing member 130 of FIG. 1C may include one or more metal members or one or more glass members. The housing member 130 may define all four sides or a continuous side-surface of the electronic device. In one example, the side surface 106 is formed from a series of metal segments that are separated by polymer or dielectric segments that provide electrical isolation between adjacent metal segments. As additional examples, the side surface 106 may be defined by one or more glass members, glass ceramic members, or members including a glass and a glass ceramic. The cover assemblies 122 and 124 may be coupled to the housing member 130 using a fastener or fastening technique. For example, the cover assemblies 122 and 124 may be coupled to the housing member 130 using an adhesive, an engagement feature, a fastener, or a combination of any of these.

While the example electronic device 100 of FIGS. 1A, 1B, and 1C includes two cover assemblies 122 and 124 including glass cover members 123 and 125, the same or similar textures and texturing processes may be applied to a cover assembly that defines any portion of an external surface of a device. For example, another example cover assembly may define a portion of or all of an internal cavity 105 of the electronic device 100 that is configured to receive the various electronic components of the electronic device 100. In some cases, the cover assembly may define an entire or substantially an entire front surface of the electronic device 100, as well as one or more sides or sidewalls of the electronic device 100. Similarly, the cover assembly may define an entire or substantially an entire rear surface of the electronic device 100, as well as one or more sides or sidewalls of the electronic device 100. Further, the glass component may be a monolithic component that defines the front surface, rear surface, and one or more side surfaces of the electronic device 100. In some embodiments, a single cover assembly (e.g., the cover assembly 124) may have different laser-textured surfaces in different regions of the element.

Figure 2A:
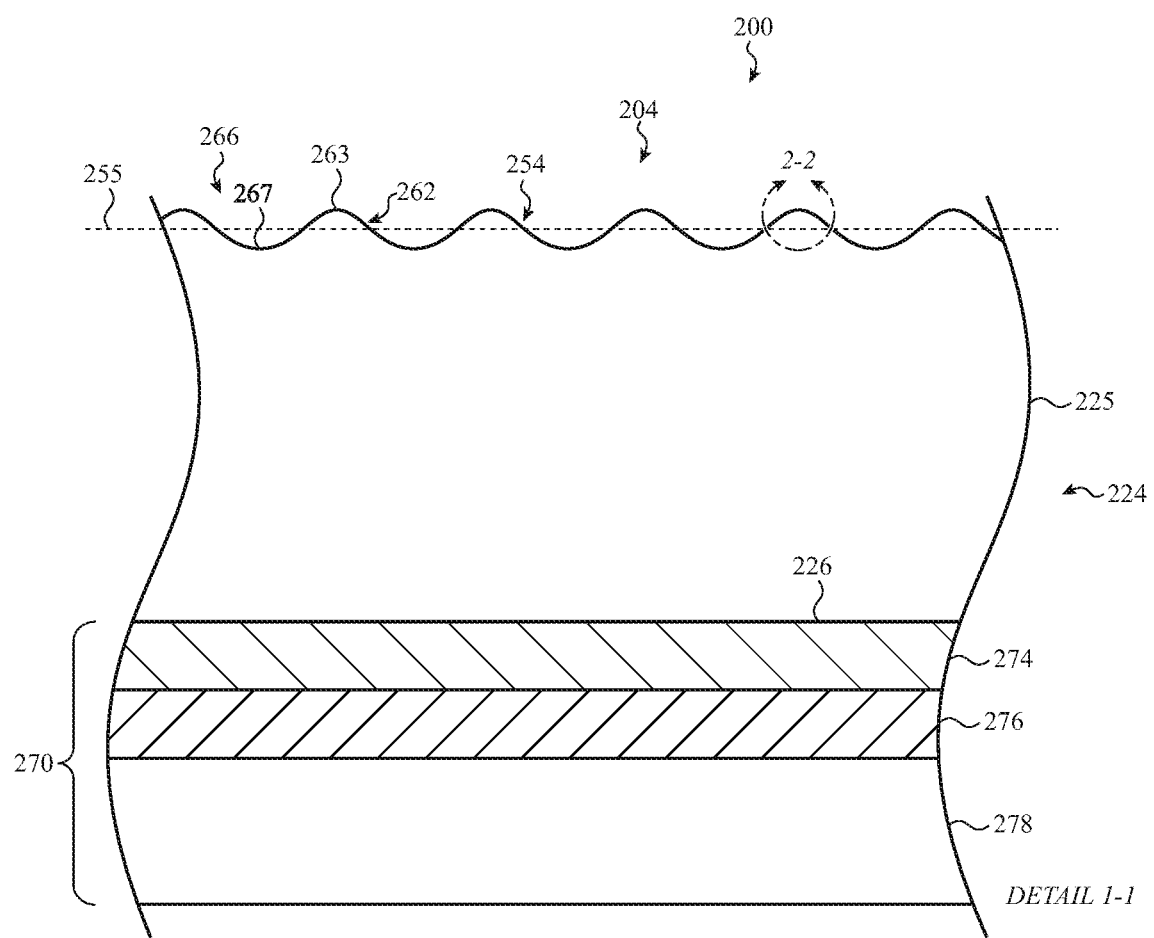
FIG. 2A shows a partial cross-section view of the electronic device of FIG. 1B.

FIG. 2A shows a partial cross-section view of an electronic device 200. Electronic device 200 may be an example of the electronic device of FIG. 1B. with the cross-section taken through detail area 1-1 of FIG. 1B. The cover assembly 224 shown in FIG. 2A includes a glass cover member 225 and may be an embodiment of the cover assembly 124 of FIG. 1B. The details provided with respect to the cover assembly 124, the glass cover member 125, and other textured cover assemblies and glass cover members described herein are applicable to cover assembly 224 and glass cover member 225 and, for brevity, are not repeated here.

Figure 2B:
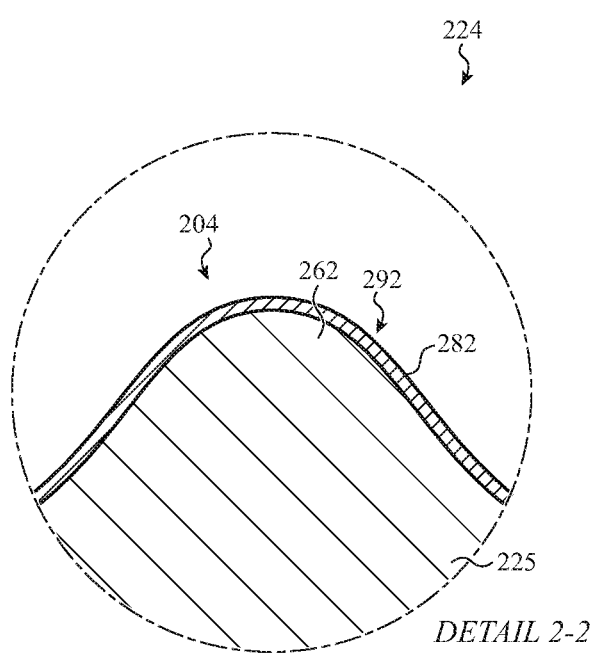
FIG. 2B shows a detail view of the cover assembly of FIG. 2A.

The glass cover member 225 defines a laser-textured surface 254. As shown in FIG. 2, the laser-textured surface 254 is an exterior surface of the glass cover member. The laser-textured surface 254, in combination with any coatings applied to the laser-textured surface (e.g., coating 282 of FIG. 2B), may define the textured rear surface 204 of the electronic device 200. A decorative coating 270 is disposed along an interior surface 226 of the glass cover member 225. The decorative coating 270, as seen through the glass cover member 225, may provide a decorative effect to electronic device 200.

As schematically shown in FIG. 2A, the laser-textured surface 254 includes laser-formed features, such as hill features 262 and valley features 266. Each hill feature 262 may be characterized by a peak 263 located at a maximum point of the hill 262. Similarly, each valley feature 266 may be characterized by a minimum point 267. The height of a maximum or a minimum point on the surface may be measured with respect to a reference surface 255, such as the arithmetical mean of the laser-textured surface. In some embodiments, the laser-textured surface may define an irregular set of hills and valleys. The irregular set of hills and valleys may have an irregular spacing, such as a non-uniform spacing or a distribution of spacing values, between hill features, valley features, or a combination thereof. The set of hills and valleys may have a random or pseudorandom distribution of spacing values.

The laser-formed features 262 and 266 may be configured to provide a desired tactile feel to the laser-textured surface. For example rounded hills 262 and valleys 266 may provide a smooth feel to the laser-textured surface and to a corresponding external surface 204 of the electronic device (see FIG. 2B), especially as compared to more sharply-defined features with distinct edges or pointed peaks and/or valleys. In some embodiments, the height, shape, and spacing of the laser-formed features 262 and 266 may affect the contact area between a moving object and the surface of the glass cover member. For example, a finger moving across laser-formed hills 262 and valleys 266 may not contact the deepest parts of the valleys.

Without being bound to a particular theory, controlling the contact area between the object and the surface of the glass cover member can help control the coefficient of friction between the cover assembly and an object in contact with the cover assembly. In some embodiments, the contact area between an object and the laser-textured surface is different than a contact area between the same object and a smooth surface (e.g., a polished or un-textured glass surface).

The laser-textured surface 254 may be configured to provide certain optical properties. For example, the laser-formed features 262 and 266 may be configured to provide a low-gloss appearance to the surface. For example, the laser-textured surface, after application of decorative coating 270, may have a gloss value of less than 10 gloss units or from 2 to 10 gloss units as measured at 60 degrees. In some cases, the texture of the laser-textured surface 254 may cause the glass cover member 225 to appear translucent, rather than transparent (before application of any cosmetic or decorative coating(s)). In some cases, the gloss of the textured region may be measured using commercially available equipment and according to ASTM or ISO standard test methods. The angle measurement may refer to the angle between the incident light and the perpendicular to the laser-textured surface.

The laser-textured surface 254 may be configured so that it lacks a perceptible visual texture. For example, the laser-textured surface 254 or the corresponding portion of the external surface of the electronic device may have a contrast variation less than a threshold value for visual perception. In some embodiments the graininess, which relates to a perceived variation in lightness and darkness across the surface, may be less than a specified value. The graininess of the laser-textured surface 254 may be measured under diffused illumination using commercially available equipment. In some cases, an image of the laser-textured surface may be obtained using a digital camera and the lightness of each pixel of the image may be determined, thereby allowing determination of the lightness variation across the laser-textured surface. For example, the BYK-mac device available from BYK may produce a graininess value determined from a histogram of the lightness levels. For example, the graininess of the laser-textured surface may be less than about 1.

As a result, the laser-textured surface 254 may not substantially affect the visual uniformity of a coating as viewed through the glass cover member. In some cases, the coating, as viewed through the laser-textured surface may have a color variation less than a specified value. For example, an image of the coating as viewed through the glass cover member may be obtained using a digital camera and the color of each pixel of the image may be determined, thereby allowing determination of the color and/or lightness variation. The color may be assessed using standard colorimetry techniques. For example, the coordinates in CIEL*a*b* (CIELAB) color space may be used to characterize the color, wherein L* represents brightness, a* the position between red/magenta and green, and b* the position between yellow and blue. The lightness of each pixel (as measured under diffuse illumination) may be used to determine the graininess of the decorative coating as viewed through the glass cover member and may be measured as previously described. Similarly, the color and/or lightness variation of the corresponding portion of the external surface of the electronic device (for example after application of a fluorinated coating and the decorative coating) may be measured and may be less than a specified value. Further, a portion of the glass cover member or a coating (e.g. an exterior or interior coating layer) which appears substantially colorless or optically clear may have an absolute value of each of a* and b* may be less than 5, less than 3, or less than or equal to 2 and the value of L* may be greater than 90, greater than 95, or greater than 98.

The laser-textured surface 254 may be described by various surface texture parameters. In some embodiments, the laser-textured surface 254 may be described by areal surface texture parameters such as amplitude parameters, spatial parameters, and hybrid parameters. Surface filtering may be used to exclude surface noise and/or surface waviness before determining the surface texture parameters. In addition, a segmentation technique may be used to determine feature parameters such as the maximum diameter, the minimum diameter, the area, and the perimeter. These parameters may be calculated on the basis of the feature shape as projected on to the reference surface (e.g., a reference plane). Mean values may be determined for a given class of features (e.g., hills or valleys). Surface texture parameters and methods for determining these parameters (including filtering and segmentation) are described in more detail in International Organization for Standardization (ISO) standard 25178 (Geometric Product Specifications (GPS)—Surface texture: Areal). These surface texture parameters may be measured using commercially available equipment.

The laser-textured surface 254 may be characterized, in part, by the heights of the laser-formed features. For example, the laser-textured surface 254 may be characterized by the root mean square height $S_q$ or the arithmetic mean height $S_a$ of the surface. The root mean square height of the surface may be greater than zero and less than about 1.5 microns, less than or equal to about 1 micron, from about 0.1 microns to about 1.5 microns, from about 0.25 microns to about 1.0 microns, or from about 0.5 microns to about 1.5 microns.

In addition, the laser-textured surface may be characterized by lateral parameters, such as the distance between peaks. As previously discussed, the spacing between peaks may be irregular (i.e., non-uniform). The average distance between peaks may also be referred to as the average pitch or mean pitch. The average pitch may be from about 1 micron to about 20 microns, from about 1 micron to about 15 microns, from about 2.5 microns to about 10 microns, from about 1 micron to about 10 microns, or from about 5 microns to about 15 microns. Further, the laser-textured surface may be characterized by a combination of amplitude parameters and lateral parameters. For example, the ratio of an amplitude of the laser-formed features to a spacing of the peaks may be used to characterize an aspect ratio of the laser-textured surface. In some embodiments, this ratio may be from about 0.01 to about 0.2 or from about 0.02 to about 0.1.

A hill feature 262 may be configured so that the portion of the hill feature around the peak 263 is rounded. As discussed in further detail with respect to FIG. 8, the rounding of the peaks may result at least in part from flow, sagging, and/or melting of glass material of the glass cover member 225 during the laser-texturing process. For example, as described herein, the laser-texturing process may include multiple passes of a laser beam on the surface of the glass cover member 225, where earlier passes of the laser impart a certain amount of heat to the glass cover member 225, and later passes are applied while the glass cover member 225 is still heated from the earlier passes. Due to the heat remaining in the glass cover member 225 from the earlier passes, the later passes may round off previously formed sharp edges, and may also produce new features with more rounded edges or shapes than would occur with an un-heated cover member 225.

The laser-textured surface may be characterized by the curvature of the peaks (also referred to as summits), such as by the arithmetic mean summit curvature $S_{sc}$. In some embodiments, the arithmetic mean summit curvature is greater than zero and less than about 1.5 microns$^{-1}$, about 0.1 microns$^{-1}$ to about 1.2 microns$^{-1}$, from about 0.25 microns$^{-1}$ to about 1.0 microns$^{-1}$, or from about 0.5 microns$^{-1}$ to about 1.5 microns$^{-1}$.

A hill feature 262 and/or a valley feature 266 may also be configured so that a side portion of the feature is sloped. As discussed in further detail with respect to FIG. 8, the slope of the hill features 262 and the valley features 266 may result at least in part from flow of glass material of the glass cover member 225 during the laser-texturing process (e.g., produced during subsequent laser passes after an initial laser pass that imparted heat to the glass material). The laser-textured surface may be characterized by the root mean square surface slope ($S_{dq}$), also referred to as the root mean square gradient. In some embodiments, the root mean square slope may be greater than zero and less than about 1 micron, from about 0.1 to less than about one micron, greater than about 0.25 microns and less than about 1 micron, or greater than about 0.25 microns and less than about 0.75 microns.

As shown in FIG. 2A, a cosmetic or decorative coating 270 may be disposed along an interior surface 226 of a glass cover member 225 (and hence along the interior surface of cover assembly 224). In the example of FIG. 2A, the decorative coating 270 is a multilayer coating that includes a first color layer 274 and a second color layer 276. The decorative coating 270 shown in FIG. 2A also includes an optically dense layer 278.

In some cases, the cosmetic or decorative coating 270 comprises a polymer. The cosmetic or decorative coating 270 may comprise at least 40%, 50%, 60%, or 70% of the polymer and may therefore be referred to as a polymer-based coating or a polymeric coating. When the cosmetic or decorative coating 270 further comprises a colorant, the polymer may act as a binder for the colorant. The colorant (e.g., a pigment) may be substantially dispersed in a matrix of the polymer. As examples, the polymer may be polyester-based, epoxy-based, urethane-based, or based on another suitable type of polymer or copolymer. The cosmetic or decorative coating 270 may further comprise optional additives such as one or more extenders, diluents, polymerization initiators, and/or stabilizers. In some embodiments, the polymer has a cross-linked structure.

In some embodiments, at least one of the color layers 274 and 276 (which may also be referred to as ink layers) comprise a polymer and a colorant dispersed in the polymer, though any pigment, paint, ink, dye, sheet, film, or other layer may be used as the decorative coating 270 or a portion thereof. Each of the color layers, such as color layers 274 and 276, may be transparent, translucent, or opaque. Each of the color layers may include the same colorant or different color layers may include different colorants. The thickness of each of the color layers 274 and 276 may be from about 2 microns to about 10 microns.

The optical density of the optically dense layer 278 may be described by OD=log$_{10}$ (initial intensity/transmitted intensity) and may be greater than or equal to 1, greater than or equal to 2, or greater than or equal to 3. Generally, the optically dense layer 278 comprises a polymer. The optically dense layer 278 may further comprise one or more pigments, dyes, or a combination thereof. As an example, the optically dense layer 278 has substantially wavelength independent (neutral) reflectance and/or absorption spectrum over the visible range. In addition, the optically dense layer 278 may have an achromatic characteristic color. The thickness of optically dense layer 278 may be from about 2 microns to about 10 microns.

In further embodiments a decorative coating may comprise a metal layer and an optically clear layer alternately or in addition to a color layer and/or an optically dense layer. Such a metal layer may give a metallic effect to the decorative coating as seen through the glass cover member. For example, the metal of the layer may be selected from aluminum, copper, nickel, silver, gold, platinum, and alloys thereof. The metal layer may be configured to at least partially transmit visible light. In embodiments, the metal layer may have a thickness greater than about 0.5 nm and less than 10 nm, less than 5 nm, less than 3 nm, less than 2 nm, or less than 1 nm. The optically clear layer may limit or prevent propagation of cracks from the metal layer into the glass cover member 225. The optically clear layer may be a polymeric layer and may have a thickness from about 1 micron to about 5 microns. The optically clear layer may be disposed along the interior surface of the glass cover member 225, the metal layer may be positioned between the optically clear layer and the optically dense layer, a first color layer may be positioned between the metal layer and the optically dense layer, and a second color layer may be positioned between the first color layer and the optically dense layer.

In addition, the decorative coating may comprise additional polymeric layers behind and disposed along the optically dense layer. If components of the electronic device are glued to the decorative coating, these additional layers may include a protective layer which protects the color layers of the multilayer coating from damage due to the glue. The additional layers may further include a layer inwards of the protective layer which facilitates adhesion of the decorative coating to the glue.

In some embodiments, a cover assembly, such as cover assembly 224, may include a coating applied over the laser-textured surface of a glass cover member, as shown in FIG. 2B. FIG. 2B shows a detail view of area 2-2 of the cover assembly 224 of FIG. 2A. As shown in FIG. 2B, the glass cover member 225 defines a hill feature 262. The cover assembly 224 further includes a coating 282 disposed on the hill feature 262. The combination of the hill feature 262 and the coating 282 may define a surface structure 292 of the cover assembly 224. More generally, the combination of the laser-formed features (e.g., 262) and the coating 282 may define the texture of the exterior surface 204 of the electronic device.

Figure 8:
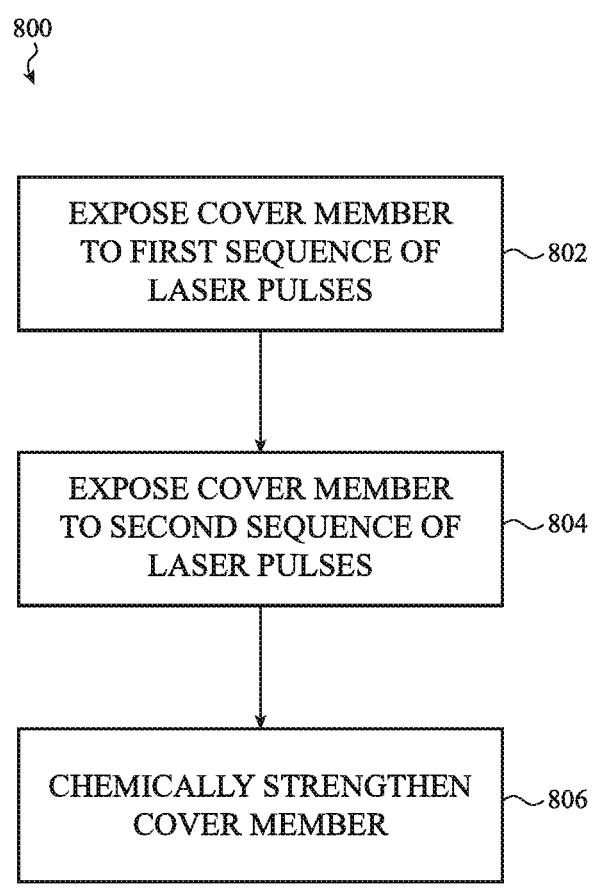
FIG. 8 shows a flow chart of a process for forming a laser-textured glass cover member.

For example, the coating 282 may provide resistance to oils and other deposits on the enclosure. The coating may be a fluorinated coating. For example, a fluorinated coating may comprise a fluorinated material, such as a fluorinated oligomer or polymer, to impart oleophobic and/or hydrophobic properties. Such coatings are discussed in further detail with respect to FIG. 8. The discussion provided with respect to FIG. 8 is generally applicable herein and, for brevity, is not repeated here.

A cover assembly including a coating disposed on an exterior surface of the glass cover member may be characterized in terms of the surface texture parameters and the optical properties of the cover assembly. Such a coating is typically thin, such as having a thickness of 50 nm or less. Therefore, the surface texture parameters and the optical properties of the cover assembly may be similar to those of the laser-textured surface. Values for the surface texture parameters and the optical properties of the cover assembly therefore may be as previously described for the laser-textured surface in some embodiments.

Figure 3:
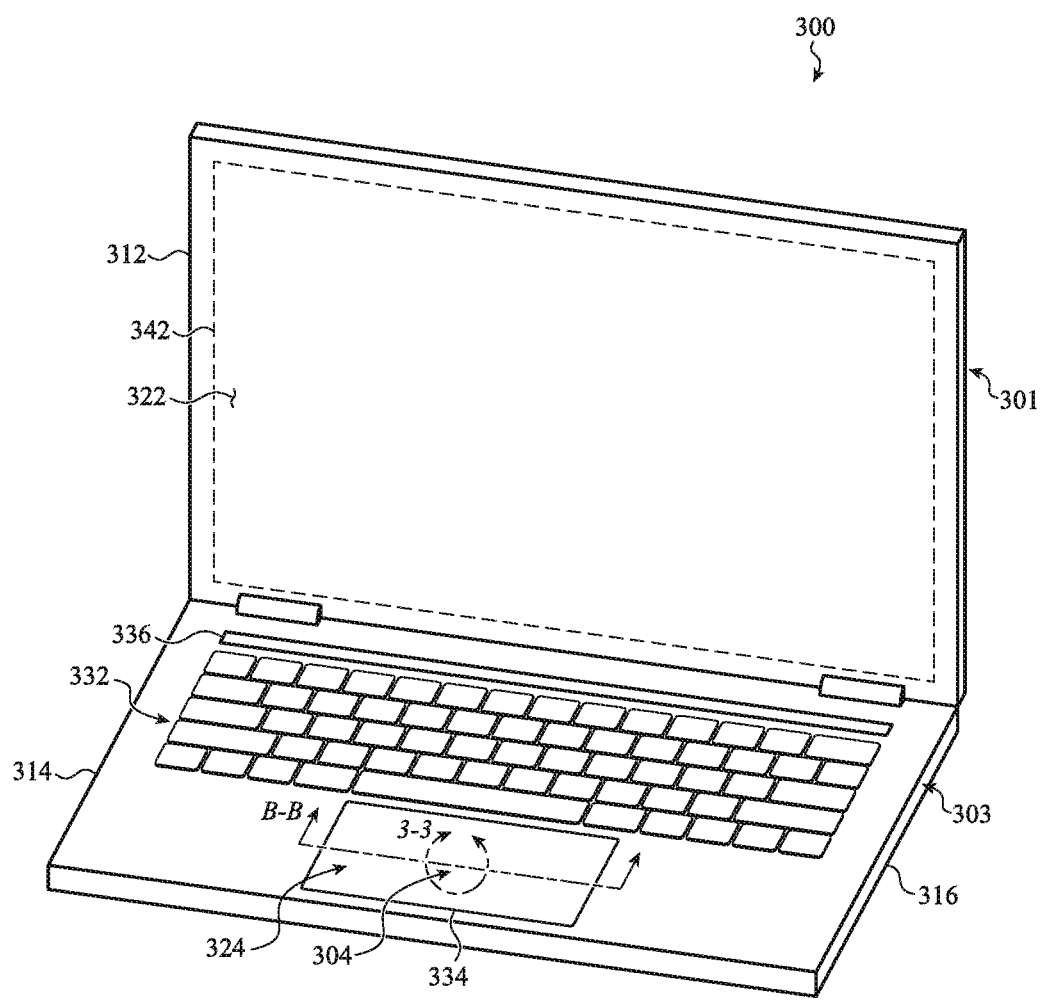
FIG. 3 shows another example electronic device including a laser-textured glass cover member.

FIG. 3 shows another example of an electronic device including a laser-textured glass cover member. Electronic device 300 may be a laptop computer. As shown in FIG. 3, the electronic device 300 has a display portion 301 and a base portion 303 pivotally coupled to the display portion. The display portion 301 includes a display housing 312 and a display 342 at least partially within the display housing. A cover assembly 322 is provided over the display 342. The cover assembly 322 may be similar in some respects to cover assembly 124 of FIG. 1B and other cover assemblies described herein and description of shared or similar features is omitted to reduce redundancy.

The base portion 303 is configured to receive various types of user inputs, such as touch inputs, force inputs, and combinations of touch and force inputs. As shown in FIG. 3, the base portion 303 includes a top case 314 which defines a keyboard region 332 and touch input regions 334 and 336. As shown in FIG. 3, touch input region 334 includes a cover assembly 324 defining a textured external surface 304 of the device 300 and may provide a trackpad for the electronic device 300. In some embodiments, a single touch input region (e.g., touch input region 334) may include differently textured surfaces in different regions of the element. Further different touch input regions (e.g., touch input regions 334 and 336) may include differently textured surfaces. As discussed in more detail with respect to FIG. 4, the electronic device 300 may comprise a touch sensor configured to detect a touch or touch input along touch input region 334. The top case 314 may be coupled to a bottom case 316 and the top case 314 and the bottom case 316 may together define a portion of an interior volume of the base portion 303.

Figure 4:
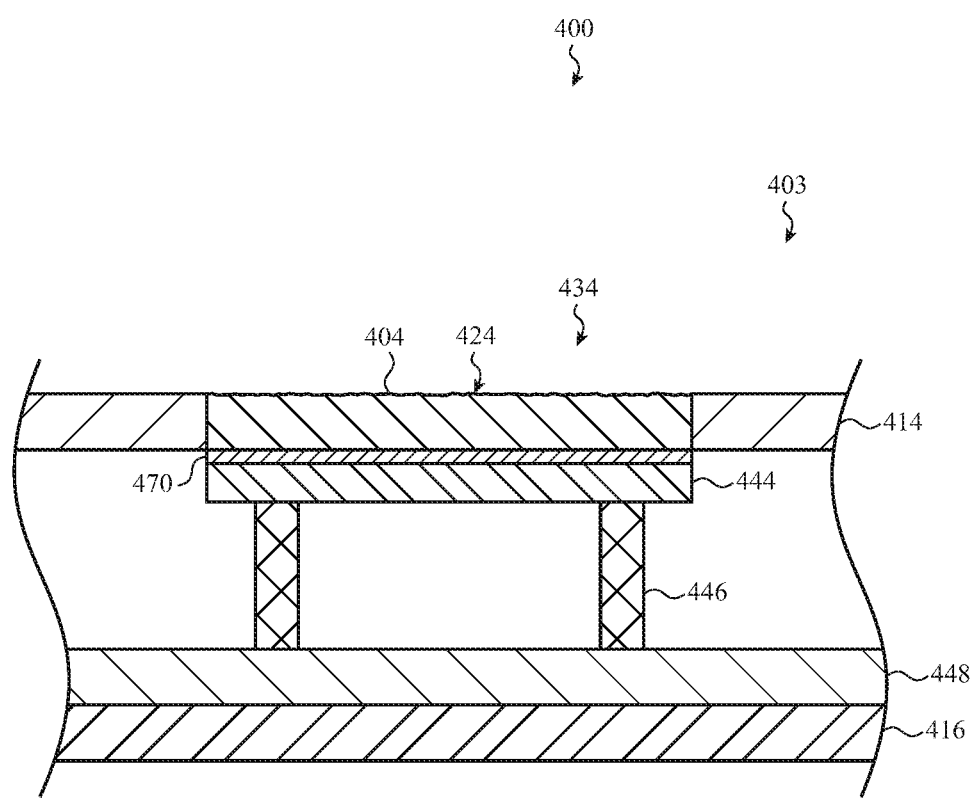
FIG. 4 shows a partial cross-section view of the electronic device of FIG. 3.

FIG. 4 shows a schematic cross-sectional view of the electronic device of FIG. 3. The cross-section is taken through a touch input region 434 of a base portion 403 of the electronic device 400 (e.g., along B-B). As shown in FIG. 4, the touch input region 434 includes a cover assembly 424 which defines a textured external surface 404 of the electronic device. The cover assembly 424 is coupled to the top case 414. Bottom case 416 is also shown.

A decorative coating 470 is provided along an interior surface of the cover assembly 424. As shown in FIG. 4, the interior surface of the cover assembly 424 may be generally opposite the laser-textured external surface 404 of the electronic device 400. The decorative coating 470 may comprise at least one color layer. The color layer may be similar to the color layers previously described with respect to FIG. 2A. The decorative coating 470 may also form an optically dense coating. The decorative coating 470 may be an example of the cosmetic or decorative coating 270 or of any other decorative or cosmetic coatings described herein. Details of these decorative or cosmetic coatings are applicable to decorative coating 470 and, for brevity, are not repeated here.

As shown in FIG. 4, a touch sensor 444 is provided along decorative coating 470 and a force sensor 446 is provided below touch sensor 444. Additional components, schematically indicated by element 448, may also be included within the interior volume of the base portion 403. Description of additional device components is provided with respect to FIG. 1C and FIG. 11 and, for brevity, is not repeated here.

Figure 5:
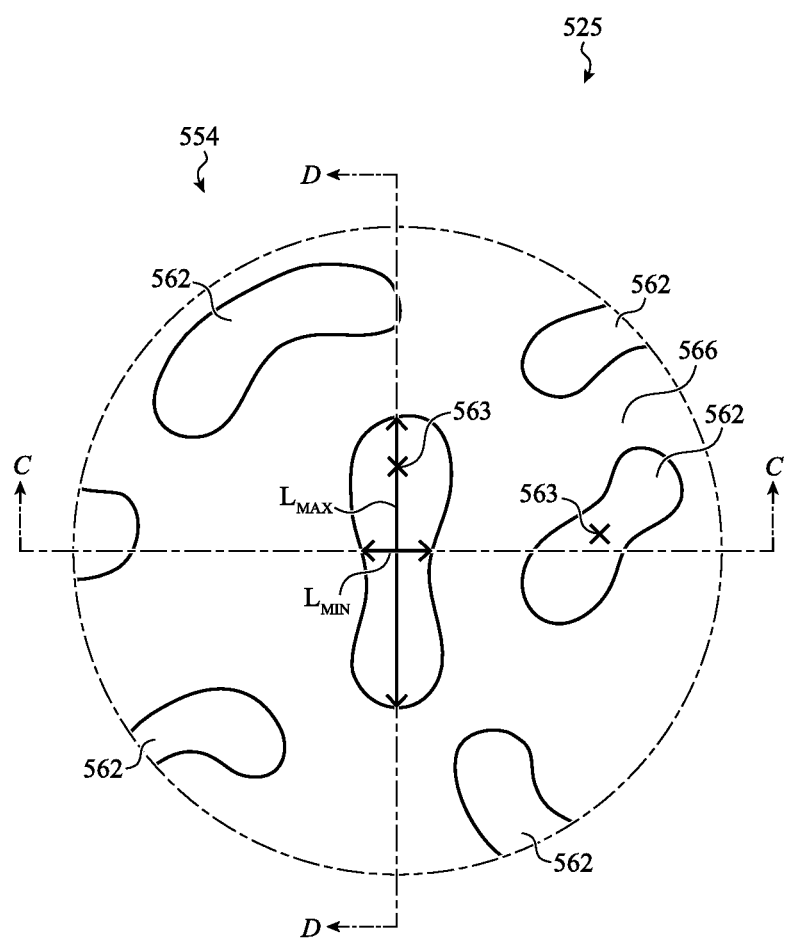
FIG. 5 shows a top view of a laser-textured surface.

It should be appreciated that the laser-formed features of a given textured glass member, such as hill features and valley features, may vary in shape and spacing. FIG. 5 shows a top view of another example laser-textured surface 554 of a glass cover member 525. The laser-textured surface 554 may be an exterior surface of the glass cover member 525. The glass cover member 525 may be an embodiment of the glass cover member 225 of FIG. 2A or any other glass cover members described herein. Details of these glass cover members are applicable to the glass cover member 525 and, for brevity, will not be repeated here. The scale of FIG. 5 is exaggerated as compared to FIGS. 2A and 4 in order to better illustrate the laser-formed features.

The laser-textured surface 554 of FIG. 5 has a non-uniform spacing between adjacent hill features 562 and peaks 563. Therefore, the hill features 562 are not arranged in a regular array. Valley features 566 are located between adjacent hill features 562. The depths of valley features 566 are not shown in the top view of FIG. 5. Because the hill and valley features are non-uniformly spaced, the overall appearance of the laser-textured surface 554 may lack a visually apparent pattern (e.g., a pattern of lines, striations, swirls, a grid, etc.), even though the features may all be formed using a predetermined pattern of laser pulses.

At least some of the hill features 562 shown in FIG. 5 are elongated (e.g., not substantially circular when viewed from above the features). In some cases, elongated hill features may be referred to as ridges. By the way example, the maximum diameter or linear dimension $L_{max}$ of a given laser-formed feature, such as a hill feature 562, may be greater than a minimum diameter or linear dimension $L_{min}$ and may be at least twice the minimum diameter or linear dimension. In some cases, the maximum linear dimension may be along a first direction, the minimum linear dimension may be along a second direction, and the first direction may be perpendicular to the second direction. The laser-textured surface 554 may be described by the same texture parameters previously described with respect to FIG. 2A.

Figure 6:
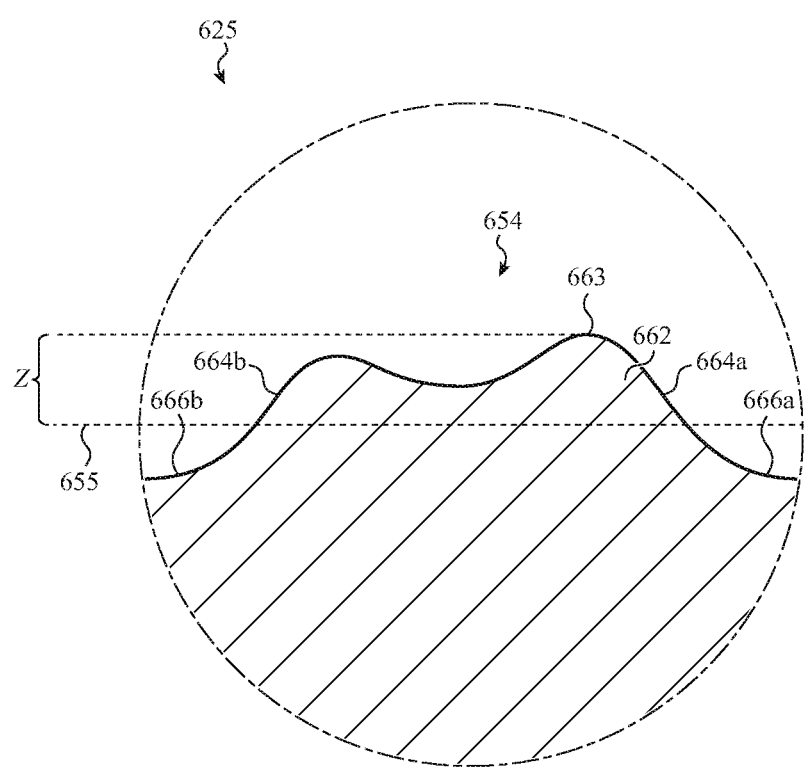
FIG. 6 shows a cross-section view of a laser-formed feature of the laser-textured surface of FIG. 5.

The hill features may also have a non-uniform and/or asymmetric peak configuration. FIG. 6, for example, shows a detailed cross-section view of an asymmetrical hill feature 662 of a laser textured surface 654 of a glass cover member 625 (e.g., along D-D). The glass cover member 625 may be an embodiment of the glass cover member 525 of FIG. 5 or any other glass cover members described herein. Details of these glass cover members are applicable to the glass cover member 625 and, for brevity, will not be repeated here.

Peak 663 of the hill feature 662 has a height Z above the reference surface 655 and is not centrally located on the hill feature 662. Further, the slope 664a of the hill feature 662 differs from the slope 664b. The shapes of the valleys 666a and 666b also differ. The laser-textured surface 654 may be described by similar surface texture parameters as previously described with respect to FIG. 2A.

Figure 7:
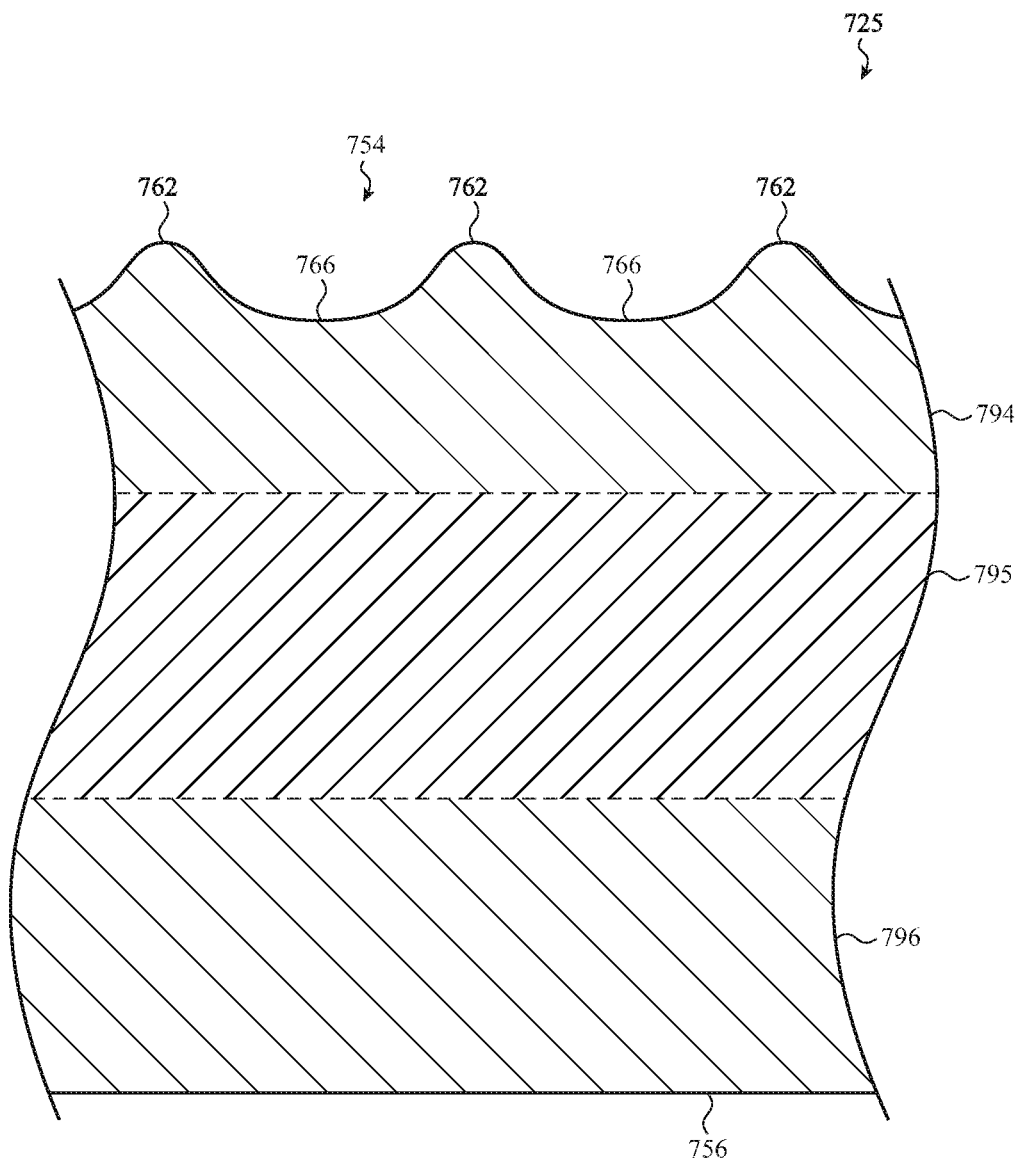
FIG. 7 schematically shows a laser-textured glass cover member after chemical strengthening.

The glass cover member may be chemically strengthened by ion-exchange after the laser-textured surface is formed. FIG. 7 schematically illustrates a partial cross-section view of a glass cover member 725 having a laser-textured surface 554 and an interior surface 756. The laser-textured surface 554 may be an exterior surface of the glass cover member 525. For example, FIG. 7 may be an example of the glass cover member 525 of FIG. 5 sectioned along C-C.

FIG. 7 schematically illustrates a compressive stress layer 794 extending from the laser-textured surface 754 and a compressive stress layer 796 extending from the interior surface 756 of a glass cover member 725 (not shown to scale). A tensile stress layer 795 is positioned between the compressive stress layers 794 and 796. The glass cover member 725 may be an embodiment of the glass cover member 525, the glass cover member 225 of FIG. 2A, or any other glass cover members described herein and for brevity the details of those glass cover members is not repeated here.

In embodiments, the strength of a chemically strengthened glass cover member with a laser-textured surface is greater than or equal to 85%, 90%, or 95% of a chemically strengthened reference glass cover member that does not include a laser-textured surface. For example, a reference glass cover member may have a surface roughness (e.g., Sq) less than that of the laser-textured surface, which may result from a down-draw process, a fusion process, or a subsequent polishing process. A reference glass cover member may also have a thickness equal to the maximum thickness of the laser-textured glass cover member (or to its thickness prior to laser-texturing).

In some cases, the depth of the compressive stress layers 794 and 796 may be from 75 microns to 250 microns, from 100 microns to 250 microns, or from 125 microns to 250 microns. In some embodiments, the compressive stress layers 794 and 796 may differ, so that the chemical strengthening is asymmetrical. The asymmetry may be detectable but may not detrimentally affect the performance of the chemically strengthened glass cover member. For example, the laser-texturing process may produce a change in the density of the network structure of a glass material of the glass cover member. For example, the laser-texturing process may increase the density of the glass material in the vicinity of the laser-formed features. Although this change in density may not be large, it may modify diffusion of the ions at the laser-textured surface as compared to the interior surface of the glass cover member (as explained in more detail with respect to FIG. 8). An increase in the density of the glass material at the laser-textured surface may produce a somewhat higher surface compressive stress and/or shallower depth of the compressive stress layer 794 as compared to the compressive stress layer 796.

For simplicity of illustration, coatings (e.g., oleophobic coatings) on the laser-textured surfaces 554, 654, and 754 are not shown in FIGS. 5, 6, and 7. However, coatings may be applied to these laser-textured surfaces as previously described with respect to FIG. 2B. Typically, such coatings are applied after laser-texturing and chemical strengthening.

FIG. 8 shows a flow chart of a process 800 for forming a laser-textured surface of a glass cover member. The laser textured surface may define an exterior surface of the glass cover member. The process 800 (also referred to as method 800) may include multiple laser-texturing operations, as indicated by FIG. 8. For example, each laser-texturing operation may use a pulsed laser beam to remove glass material from a surface of the glass cover member.

The glass material may be an oxide-based material such as a silica-based material. The glass material of the glass cover member may have a network structure, such as a silicate-based network structure. For example, the glass material may comprise an aluminosilicate glass or a boroaluminosilicate glass. As used herein, an aluminosilicate glass includes the elements aluminum, silicon, and oxygen, but may further include other elements. Similarly, a boroaluminosilicate glass includes the elements boron, aluminum, silicon, and oxygen, but may further include other elements. For example, an aluminosilicate glass or a boroaluminosilicate glass may further include monovalent or divalent ions which compensate charges due to replacement of silicon ions by aluminum ions. Suitable monovalent ions include, but are not limited to, alkali metal ions such as $Li^+$, $Na^+$, or $K^+$. Suitable divalent ions include alkaline earth ions such as $Ca^{2+}$ or $Mg^{2+}$. The glass material of the glass cover member may be ion exchangeable.

As shown in FIG. 8, the process 800 may include the operation 810 of performing a first laser-texturing operation. The first laser-texturing operation may form a first surface texture on the surface of the glass cover member. The first laser-texturing operation may include directing a first sequence of laser pulses onto a surface of the glass cover member.

The first sequence of laser pulses may be produced by a first laser. Typically, the first laser produces a laser beam, such as a pulsed laser beam, which is focused onto the surface of the glass cover member. The focused laser beam may define a focal volume, which may in turn define an exposure area on the surface of the glass cover member. The focal volume may extend a certain depth into the glass cover member, so that the laser beam interacts with a region of the glass cover member below the surface.

The laser beam may be scanned along one more paths on the glass cover member while a sequence of pulses is emitted from the laser. Typically, the one or more paths form a scan pattern with respect to the surface of the glass cover member such as a raster pattern (e.g., a series of linear paths spaced apart from one another), a serpentine pattern, a spiral pattern, and the like. The first laser may be controlled to produce a first pattern of laser pulses.

The operation of directing the first sequence of laser pulses onto the surface of the glass cover member may produce a set of first exposure areas on the surface of the glass cover member. The spacing of the first exposure areas may be non-uniform. For example, a first pair of adjacent first exposure areas may be spaced differently than a second pair of adjacent first exposure areas. Typically at least some of the first exposure areas overlap. For example, a first pair of adjacent first exposure areas may at least partially overlap. The amount of the overlap may vary due to the non-uniform spacing between adjacent exposure areas. The set of first exposure areas may form a first pattern of exposure areas. In some cases, exposure areas may be referred herein to as spot areas.

Figure 9:
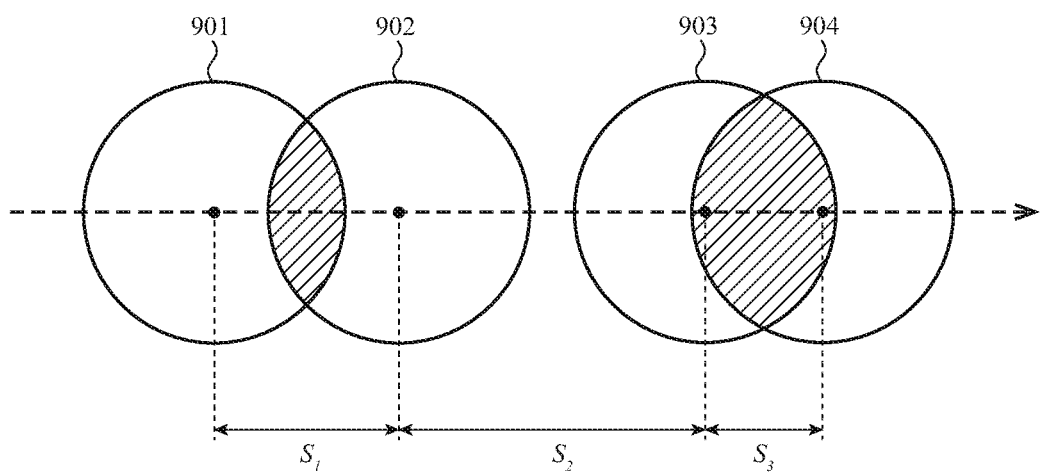
FIG. 9 schematically shows a detail view of a sequence of laser exposure areas on the glass member.

For example, FIG. 9 schematically shows a detail view of a sequence of laser exposure areas on the glass member. The sequence includes four exposure areas: 901, 902, 903, and 904. As shown in FIG. 9 the spacing between centers of adjacent exposure areas, S1, S2, and S3, is not uniform. More generally, the spacing between centers of adjacent exposure areas can be random, non-uniform, uniform, or combinations of these. In addition, the amount of the overlap between exposure areas 901 and 902 shown in FIG. 9 is different than the amount of overlap between exposure areas 903 and 904. Further, the spacing between other exposure areas created by a full laser scan may continue to be non-uniform, and may not simply repeat the pattern of distances shown in FIG. 9. In some cases, the spacing between adjacent exposure areas has a random or pseudo-random distribution of spacing values.

A laser controller may be used to obtain a sequence of exposure areas with uneven spacing as schematically illustrated in FIG. 9. The controller may turn the laser on to deliver a pulse to a desired exposure area on the surface and to turn the laser off when no pulse is to be delivered. Such a controller also allows a desired spacing to be achieved between exposure areas. The laser may be under computer numerical control (CNC) and a software file (e.g., a raster file) may determine the positions of the exposure areas. As noted above, the spacing may have a random or pseudorandom distribution of spacing values, but may be a predetermined spacing pattern that can be reproduced on multiple glass members.

In some embodiments, each pulse of the laser beam may transfer energy to the glass cover member, including the exposure area and the region of the glass cover member within the focal volume. In order to etch the surface of the glass cover member, a sufficient amount of energy is transferred to the glass cover member along the exposure area to cause ablation of glass material. A given glass material may have an ablation threshold, which may be described in terms of the fluence ($J/cm^2$) of the laser.

Ablation of glass material can form an ablation feature along the surface of the glass cover member. An ablation feature formed along a relatively flat surface of a glass cover member may include a depression (or crater) in the surface of the glass cover member. As the surface of the glass cover member becomes more rough (e.g., as a result of a previous laser-texturing operation), the shape of the ablation features may become less regular.

Directing the first sequence of laser pulses from the first laser onto the surface of the glass cover member may form a set of first ablation features on the surface. Adjacent first ablation features may be unevenly spaced. For example, the spacing between centers of adjacent (e.g., neighboring) first ablation features may be non-uniform. In addition, at least some of the adjacent first ablation features may overlap. The set of first ablation features may form a first pattern of first ablation features over the surface of the glass cover member.

Figure 10A:
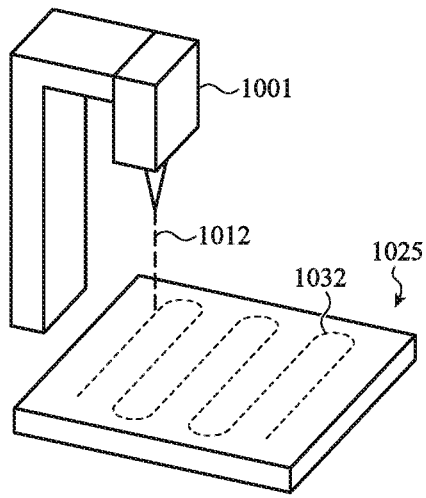
FIG. 10A schematically shows a first laser-texturing operation.

FIG. 10A schematically shows a first laser-texturing operation. As shown in FIG. 10A, a first pulsed beam 1012 from a first laser 1001 is scanned over the glass cover member 1025 along a first scan pattern 1032 schematically illustrated by a dashed line. It should be appreciated that relative movement of the first pulsed beam 1012 with respect to the glass cover member 1025 can be achieved by moving the first pulsed beam 1012, by moving the glass cover member 1025, or both.

Figure 10B:
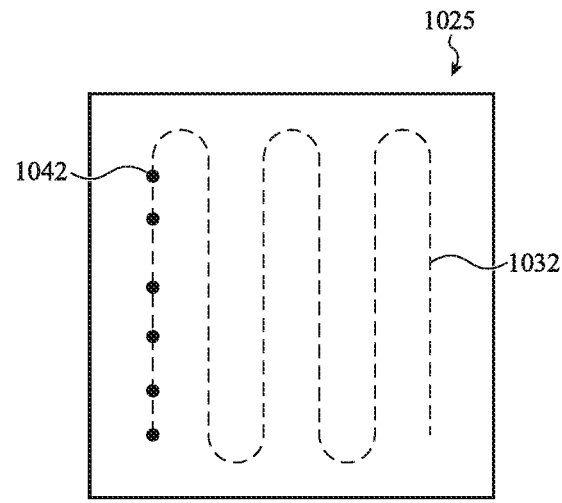
FIG. 10B schematically shows an enlarged view of the glass cover member partway through the first laser-texturing operation.

FIG. 10B schematically shows an enlarged view of the glass cover member and the first scan pattern. As shown in the top view of FIG. 10B, the first scan pattern 1032 forms a serpentine pattern over the surface of the glass cover member 1025. First ablation features 1042 are indicated in FIG. 10B by filled circles along the first scan pattern 1032. For convenience of illustration, adjacent first ablation features 1042 are shown as being spaced apart. However, typically at least some of the adjacent first ablation features 1042 will overlap as discussed above.

Further, the energy transferred to the glass cover member from each pulse of the first sequence of laser pulses may also modify the glass material around the ablation feature. In some embodiments, the glass material around the ablation features may be raised to a first temperature as a result of the first laser-texturing operation, where the first temperature is greater than a temperature of the glass cover member prior to the first laser-texturing operation.

In some cases, the structure of the glass material around the ablation area may be different than the structure before the first laser-texturing operation. Therefore, the structure of the glass material around the ablation area after the first laser-texturing operation may be different than that in the bulk of the glass cover member, away from the ablation area. The structure of the glass material around the ablation area may be measured using spectroscopic techniques (e.g., Raman spectroscopy) or microscopic techniques. For example, the structure of the glass material around the ablation feature may be more disordered than the structure before the first laser-texturing operation. As another example, the change in the structure of the glass material around the ablation feature may produce a change in the index of refraction of the glass material around the ablation feature. In some cases, the composition of the glass material around the ablation area may change as a result of the first laser-texturing operation, for example due to diffusion of cations in the glass structure.

The first laser may be operated at a first set of laser conditions. The first laser may produce a wavelength in the infrared range (e.g., having a wavelength from about 1 μm to about 5 μm). The first laser may produce pulses having a duration from 50 femtoseconds to 50 picoseconds or from 100 femtoseconds to 10 picoseconds. In some embodiments, the first laser may be a femtosecond laser producing pulses having an effective pulse duration in the femtosecond range, such as from about 100 fs to about 800 fs, or about 200 fs to about 500 fs. The average power of the first laser may be from about 1 W to about 20 W. The repetition rate of the first laser may be from about 50 kHz to about 1000 kHz or from about 100 kHz to about 750 kHz. The scan speed may be varied as desired, and in some embodiments may be from about 500 mm/sec to about 1500 mm/sec. The spot size (e.g., the diameter or width) defined by the exposure area may be from about 10 microns to about 50 microns.

As shown in FIG. 8, the process 800 may further include the operation 820 of performing a second laser-texturing operation. The second laser-texturing operation may form a second surface texture, different from the first surface texture, on the surface of the glass cover member. The second laser-texturing operation may include directing a second sequence of laser pulses onto the surface of the glass cover member.

The second sequence of laser pulses may be produced by the first laser or by a second laser. The laser beam may be scanned along a second path, different than the first path, with respect to the glass cover member. The first path may form a first scan pattern and the second path may form a second scan pattern. In some embodiments, the second scan pattern has the same form as the first scan pattern, but is rotated with respect to the first scan pattern. For example, both the first scan pattern and the second scan patterns may be raster patterns. The second scan pattern may be rotated from 45 degrees to 90 degrees with respect to the first scan pattern in either the clockwise or anticlockwise direction. For example, the glass cover member may be rotated by the desired angular amount after directing the first sequence of laser pulses onto the surface and prior to directing the second sequence of laser pulses onto the surface. The second laser-texturing operation may expose the glass cover member to a second pattern of pulses. The second pattern of pulses may be rotated with respect to the first pattern by a rotation angle. For example, the rotation angle may be greater than zero and less than 180 degrees.

The operation of directing the second sequence of laser pulses onto the surface of the glass cover member may produce a set of second exposure areas on the surface of the glass cover member. The set of first exposure areas may be different than the set of second exposure areas. The set of second exposure areas may form a second pattern of exposure areas different from the first pattern of exposure areas.

At least one of the second exposure areas may be offset from at least one of the first exposure areas. In addition, at least one of the second exposure areas may overlap at least one of the first exposure areas. In some cases, less than all of the second exposure areas overlap the first exposure areas. If the at least one of the second exposure area is offset from and overlaps at least one of the first exposure areas, the location of the at least one of the second exposure areas overlaps but is not identical to the location of the at least one of the first exposure areas.

The spacing of the second exposure areas may be non-uniform. For example, a first pair of adjacent second exposure areas may be spaced differently than a second pair of adjacent second exposure areas. Typically at least some of the second exposure areas overlap. For example, a first pair of adjacent second exposure areas may at least partially overlap but the amount of the overlap may vary due to the uneven spacing between adjacent exposure areas.

The second laser may be operated at a second set of laser conditions, with the second set of laser conditions being similar to those described for the first set of laser conditions. In some embodiments, the first laser and the second laser may both be the same picosecond laser or the same femtosecond laser. The second laser may be controlled so that the second sequence of laser pulses is delivered to the surface in such a way as to create an uneven spacing between adjacent exposure areas in a similar fashion as described for the first sequence of laser pulses.

Directing the second sequence of laser pulses onto the surface of the glass cover member may form a set of second ablation features on the surface. Adjacent second ablation features may be unevenly spaced and least some of the adjacent second ablation features may overlap. The set of second ablation features may form a second pattern of second ablation features over the surface of the glass cover member. In addition, directing the second sequence of laser pulses onto the surface of the glass cover member may cause a portion of the surface of the glass cover member to flow.

Figure 10C:
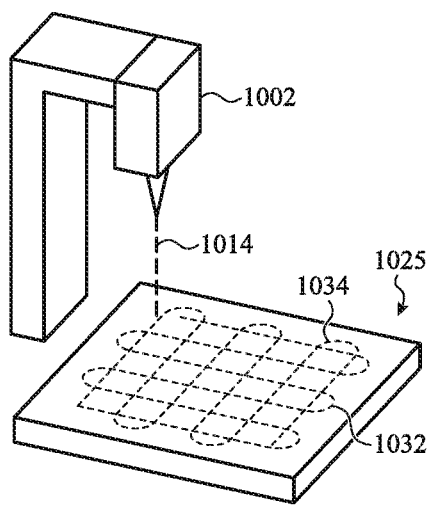
FIG. 10C schematically shows a second laser-texturing operation.

FIG. 10C schematically shows a second laser-texturing operation. As shown in FIG. 10C, a second pulsed beam 1014 from a second laser 1002 is scanned over the glass cover member 1025 along a second scan pattern 1034 schematically illustrated by a dashed line. Second scan pattern 1034 is at an angle of about 90 degrees with respect to first scan pattern 1032.

Figure 10D:
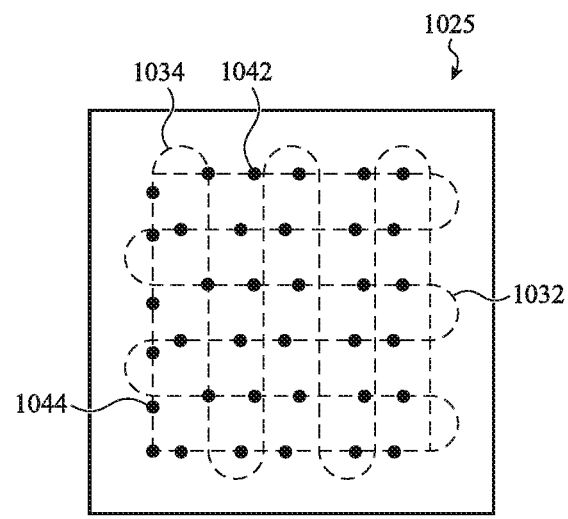
FIG. 10D schematically shows an enlarged view of the glass cover member partway through the second-laser texturing operation.

FIG. 10D shows an enlarged view of the glass cover member partway through the second laser-texturing operation. Second ablation features 1044 are indicated by filled circles along second scan pattern 1034. For convenience of illustration, adjacent second ablation features 1044 are shown as being spaced apart. However, typically at least some of the second ablation features 1044 will overlap as discussed above.

Because the surface on which the set of second ablation features are formed is rougher than that on which the set of first ablation features are formed, the second ablation features may be less regular in form than the first ablation features. The set of second ablation features partially overlap the set of first ablation features, so that the texture of the glass cover member after the second laser-texturing operation is due to the combination of the first and the second laser-texturing operations.

In some embodiments, directing the second sequence of laser pulses onto the surface of the glass cover member causes a flow of a portion of the surface of the glass cover member. Flow during the second laser-texturing operation may be enabled by a lower ablation threshold and/or a lower resistance to flow of the surface after the first laser-texturing step than prior to the first-laser texturing step. The difference in the ablation threshold and/or the resistance to flow may be due, at least in part, to a difference in roughness and/or glass material structure at the surface after the first laser-texturing step.

A temperature of a region of the glass cover member after the first laser-texturing step may be higher than the temperature of that region prior to the first laser-texturing operation, so that the first laser-texturing operation elevates the temperature of the region. In some embodiments, a time interval between the first laser-texturing operation and the second laser-texturing operation is short enough that retained heat from the first laser-texturing operation affects the second laser-texturing operation. For example, the retained heat from the first laser-texturing operation may facilitate ablation and/or flow of the glass material during the second laser-texturing operation. In addition, the second laser-texturing operation may further elevate a temperature of the region of the glass cover member. For example, if the temperature of the glass material in the vicinity of the second ablation features exceeds a threshold temperature, the viscosity of the glass material may be low enough to allow flow of the glass material. In embodiments, the threshold temperature may be an annealing point, a glass transition temperature, a softening temperature, or a working point of the glass material. In some cases, the temperature of the glass material in the vicinity of the first ablation features may be below the threshold temperature.

If laser ablation during the first laser texturing operation introduces any cracks into the glass material, flow of the glass material during a subsequent laser texturing operation can help heal the cracks. In addition, flow of the glass material can contribute to smoother surface features. For example, the laser-formed surface features may have a smaller mean peak curvature of the peaks ($S_{sc}$), a smaller root-mean-square slope ($S_{dq}$), or a combination thereof.

In some embodiments, the process 800 may further include one or more additional laser-texturing operations. For example, the process 800 may include a third laser-texturing operation. The third laser-texturing operation may form a third surface texture, different from the first surface texture and the third surface texture, on the surface of the glass cover member. The third laser-texturing operation may include directing a third sequence of laser pulses onto the surface of the glass cover member.

The laser beam may be scanned along a third path, different than the first path and the second path, with respect to the glass cover member. In some embodiments, the third path forms a third scan pattern that has the same form as the first scan pattern and the second scan pattern, but is rotated with respect to the first scan pattern and the second scan pattern. For example, each of the first scan pattern, the second scan pattern, and the third scan pattern may be a raster pattern. The third scan pattern may be rotated from 45 degrees to 90 degrees with respect to the second scan pattern in either the clockwise or anticlockwise direction.

The third laser-texturing operation may expose the glass cover member to a third pattern of pulses. The third pattern of pulses may be an unevenly-spaced pattern of laser pulses. The third pattern may be rotated with respect to the second pattern by a second rotation angle. For example, the second rotation angle may be greater than zero and less than 180 degrees.

The third sequence of laser pulses may be produced by the first laser, the second laser, or a third laser. The third laser may be operated at a third set of laser conditions, with the third set of laser conditions being similar to those described for the first and/or second set of laser conditions.

Directing the third sequence of laser pulses onto the surface of the glass cover member may produce a third set of exposure areas on the surface of the glass cover member. The third set of exposure areas may be different from the second set and the first set of exposure areas. The third set of exposure areas may have a non-uniform spacing between adjacent exposure areas as previously described for the first and the second sequences of laser pulses. The set of third exposure areas may form a third pattern of exposure areas, which may be different from the second pattern and/or the first pattern of exposure areas.

At least one of the third exposure areas may be offset from at least one of the second exposure areas and/or at least one of the first exposure areas. In addition, at least one of the third exposure areas may overlap at least one of the second exposure areas and/or at least one of the first exposure areas.

In some cases, at least one of the third exposure areas is offset from and overlaps at least one of the second exposure areas.

Directing the third sequence of laser pulses onto the surface of the glass cover member may form a set of third ablation features on the surface. Adjacent third ablation features may be non-uniformly spaced and at least some of the adjacent third ablation features may overlap. However, because the surface on which the set of third ablation features are formed is rougher than that on which the set of second ablation features are formed, the third ablation features may be less regular in form than the second ablation features. The set of third ablation features may partially overlap the set of second ablation features, so that the texture of the glass cover member after the third laser-texturing operation is due to the combination of the first, the second, and the third laser-texturing operations.

In addition, directing the third sequence of laser pulses onto the surface of the glass cover member may cause a second flow of the portion of the surface of the glass cover. The second flow resulting from the third laser-texturing operation may be different from the first flow resulting from the second laser-texturing operation. In some cases, the extent of the second flow may be greater than the extent of the first flow. For example, the first flow may occur in a first portion of glass material at the surface of the glass cover member, the second flow may occur in a second portion of the glass material at the surface of the glass cover member, and the second portion may be larger than the second portion. The rate of the second flow may be greater than the rate of the first flow. The difference between the second flow and the first flow may be due to a lower ablation threshold and/or a lower resistance to flow of the surface during the third laser-texturing step than during the second laser-texturing step. The difference in the ablation threshold and/or resistance to flow may be due, at least in part, to a difference in roughness, glass material structure, and/or temperature at the surface.

In some embodiments the glass cover member as a whole may be heated prior to and/or during one or more of the laser-texturing operations in order. For example, when the glass cover member is placed on a support during a laser-texturing operation the support may be heated to reduce a temperature gradient between the surface being ablated and a remainder of the glass cover member.

In some embodiments, the laser-texturing process may modify the glass structure and/or the composition of the glass cover member in the vicinity of the laser-formed features. For example, the laser-texturing process may produce a change in the density or the molecular structure of the network structure of the glass material, such as an increase in the density of the glass material. Although the density change may be relatively small, it may produce a detectable change in the index of refraction of the glass cover member in the vicinity of the laser-formed surface features (as measured prior to chemical strengthening). The change in the index of refraction may be detectable but may not detrimentally affect the performance of the glass cover member.

As shown in FIG. 8, the process 800 may include the operation 830 of chemically strengthening the glass cover member. The operation of chemically strengthening the glass cover member may follow the laser-texturing operations. The glass cover member may be chemically strengthened by ion exchange. During the ion exchange, ions present in the glass material can be exchanged for larger ions to form a compressive stress layer extending from a surface of the glass cover member.

For example, an ion-exchangeable glass material may include monovalent or divalent ions such as alkali metal ions (e.g., $Li^+$, $Na^+$, or $K^+$) or alkaline earth ions (e.g., $Ca^{2+}$ or $Me^+$) which may be exchanged for other alkali metal or alkaline earth ions. If the glass member comprises sodium ions, the sodium ions may be exchanged for potassium ions. Similarly, if the glass member comprises lithium ions, the lithium ions may be exchanged for sodium ions and/or potassium ions. In embodiments, the compressive stress layer extends to a depth (or thickness) in the glass substrate which is greater than a lowest depth of the surface texture.

In an example, the chemical strengthening process involves exposing the glass cover member to a medium containing the larger ion, such as by immersing the glass cover member in a bath containing the larger ion or by spraying or coating the glass with a source of the ions. For example, a salt bath comprising the ion of interest (e.g., a potassium nitrate bath) may be used for ion exchange. Suitable temperatures for ion exchange are above room temperature and are selected depending on process requirements. The ion exchange process may be conducted at a temperature below the strain point of the glass. The ion exchange process may form a compressive stress layer extending from a surface of the glass cover member, as schematically illustrated in FIG. 7 Depending on the factors already discussed above, a compression layer as deep as about 10-250 microns, can be formed in the glass cover member. The surface compressive stress (CS) may be from about 300 MPa to about 1100 MPa.

In some embodiments a compressive stress layer is formed at each of the laser-textured exterior surface and the interior surface of the glass cover member. A tensile stress layer may be formed between these compressive stress layers, as previously discussed with respect to FIG. 7.

When the laser-texturing process produces a change in the density of the network structure of the glass material, diffusion of the ions at the laser-textured surface may be modified as compared to diffusion of ions at the interior surface of the glass cover member. An increase in the density of the glass material at the laser-textured surface may produce slower diffusion of the larger ions through the laser-textured surface as compared to interior surface of the glass cover member. As a result, the compressive stress layer extending from the laser-textured surface may have a somewhat higher surface compressive stress and/or shallower depth as compared to the compressive stress layer extending from the interior surface. Conversely, a decrease in the density of the glass material at the laser-textured surface may produce a lower surface compressive stress and/or a higher depth as compared to the compressive stress layer extending from the interior surface.

In some embodiments, the process 800 further includes an operation of applying a coating, such as a hydrophobic and/or oleophobic coating, to the laser-textured surface. The coating may provide resistance to oils and other deposits on the electronic component. For example, the material may comprise a fluorinated material, such as a fluorinated oligomer or polymer, to impart oleophobic and/or hydrophobic properties. For example, the contact angle of an oil on the coating may be greater than or equal to about 65 degrees or about 70 degrees. As an additional example, the contact angle of water on the coating may be greater than or equal to 90 degrees. The fluorinated material may comprise a linear (non-branched) fluorinated molecule such as a linear fluorinated oligomer or a linear fluorinated polymer. In embodiments, the layer of the fluorinated material is from about 5 nm to about 20 nm or from about 10 nm to about 50 nm thick. The layer of the fluorinated material may be bonded directly to the laser-formed texture or may be bonded to an intermediate adhesion layer. The layer of the fluorinated material may be thin relative to at least one dimension of the laser-formed texture and may be formed either through a wet chemistry method or by a vapor deposition method.

In additional embodiments, the process 800 further includes an operation of applying a coating, such as a decorative coating, to an interior surface of the glass cover member. Such coatings are discussed in further detail with respect to FIG. 2A. A polymeric coating may be applied by methods such as spraying or printing. Printing techniques include, but are not limited to, screen printing, inkjet printing, pad printing, and the like.

FIG. 11 shows a block diagram of a sample electronic device that can incorporate a glass cover member having a laser-textured surface. The schematic representation depicted in FIG. 11 may correspond to components of the devices depicted in FIG. 1A-10D as described above. However, FIG. 11 may also more generally represent other types of electronic devices with laser-textured glass cover members as described herein.

In embodiments, an electronic device 1100 may include sensors 1120 to provide information regarding configuration and/or orientation of the electronic device in order to control the output of the display. For example, a portion of the display 1108 may be turned off, disabled, or put in a low energy state when all or part of the viewable area of the display 1108 is blocked or substantially obscured. As another example, the display 1108 may be adapted to rotate the display of graphical output based on changes in orientation of the device 1100 (e.g., 90 degrees or 180 degrees) in response to the device 1100 being rotated.

The electronic device 1100 also includes a processor 1106 operably connected with a computer-readable memory 1102. The processor 1106 may be operatively connected to the memory 1102 component via an electronic bus or bridge. The processor 1106 may be implemented as one or more computer processors or microcontrollers configured to perform operations in response to computer-readable instructions. The processor 1106 may include a central processing unit (CPU) of the device 1100. Additionally, and/or alternatively, the processor 1106 may include other electronic circuitry within the device 1100 including application specific integrated chips (ASIC) and other microcontroller devices. The processor 1106 may be configured to perform functionality described in the examples above.

The memory 1102 may include a variety of types of non-transitory computer-readable storage media, including, for example, read access memory (RAM), read-only memory (ROM), erasable programmable memory (e.g., EPROM and EEPROM), or flash memory. The memory 1102 is configured to store computer-readable instructions, sensor values, and other persistent software elements.

The electronic device 1100 may include control circuitry 1110. The control circuitry 1110 may be implemented in a single control unit and not necessarily as distinct electrical circuit elements. As used herein, "control unit" will be used synonymously with "control circuitry." The control circuitry 1110 may receive signals from the processor 1106 or from other elements of the electronic device 1100.

As shown in FIG. 11, the electronic device 1100 includes a battery 1114 that is configured to provide electrical power to the components of the electronic device 1100. The battery 1114 may include one or more power storage cells that are linked together to provide an internal supply of electrical power. The battery 1114 may be operatively coupled to power management circuitry that is configured to provide appropriate voltage and power levels for individual components or groups of components within the electronic device 1100. The battery 1114, via power management circuitry, may be configured to receive power from an external source, such as an alternating current power outlet. The battery 1114 may store received power so that the electronic device 1100 may operate without connection to an external power source for an extended period of time, which may range from several hours to several days.

In some embodiments, the electronic device 1100 includes one or more input devices 1118. The input device 1118 is a device that is configured to receive input from a user or the environment. The input device 1118 may include, for example, a push button, a touch-activated button, capacitive touch sensor, a touch screen (e.g., a touch-sensitive display or a force-sensitive display), capacitive touch button, dial, crown, or the like. In some embodiments, the input device 1118 may provide a dedicated or primary function, including, for example, a power button, volume buttons, home buttons, scroll wheels, and camera buttons.

The device 1100 may also include one or more sensors 1120, such as a force sensor, a capacitive sensor, an accelerometer, a barometer, a gyroscope, a proximity sensor, a light sensor, or the like. The sensors 1120 may be operably coupled to processing circuitry. In some embodiments, the sensors 1120 may detect deformation and/or changes in configuration of the electronic device and be operably coupled to processing circuitry which controls the display based on the sensor signals. In some implementations, output from the sensors 1120 is used to reconfigure the display output to correspond to an orientation or folded/unfolded configuration or state of the device. Example sensors 1120 for this purpose include accelerometers, gyroscopes, magnetometers, and other similar types of position/orientation sensing devices. In addition, the sensors 1120 may include a microphone, acoustic sensor, light sensor, optical facial recognition sensor, or other types of sensing device.

In some embodiments, the electronic device 1100 includes one or more output devices 1104 configured to provide output to a user. The output device 1104 may include display 1108 that renders visual information generated by the processor 1106. The output device 1104 may also include one or more speakers to provide audio output. The output device 1104 may also include one or more haptic devices that are configured to produce a haptic or tactile output along an external surface of the device 1100.

The display 1108 may include a liquid-crystal display (LCD), light-emitting diode, organic light-emitting diode (OLED) display, an active layer organic light-emitting diode (AMOLED) display, organic electroluminescent (EL) display, electrophoretic ink display, or the like. If the display 1108 is a liquid-crystal display or an electrophoretic ink display, the display 1108 may also include a backlight component that can be controlled to provide variable levels of display brightness. If the display 1108 is an organic light-emitting diode or organic electroluminescent-type display, the brightness of the display 1108 may be controlled by modifying the electrical signals that are provided to display elements. In addition, information regarding configuration and/or orientation of the electronic device may be used to control the output of the display as described with respect to input devices 1118. In some cases, the display is integrated with a touch and/or force sensor in order to detect touches and/or forces applied along an external surface of the device 1100.

The electronic device 1100 may also include a communication port 1112 that is configured to transmit and/or receive signals or electrical communication from an external or separate device. The communication port 1112 may be configured to couple to an external device via a cable, adaptor, or other type of electrical connector. In some embodiments, the communication port 1112 may be used to couple the electronic device to a host computer.

The electronic device 1100 may also include at least one accessory 1116, such as a camera, a flash for the camera, or other such device. The camera may be connected to other parts of the electronic device 1100 such as the control circuitry 1110.

As used herein, the terms "about," "approximately," "substantially," "similar," and the like are used to account for relatively small variations, such as a variation of +/−10%, +/−5%, +/−2%, or +/−1%. In addition, use of the term "about" in reference to the endpoint of a range may signify a variation of +/−10%, +/−5%, +/−2%, or +/−1% of the endpoint value. In addition, disclosure of a range in which at least one endpoint is described as being "about" a specified value includes disclosure of the range in which the endpoint is equal to the specified value.

The following discussion applies to the electronic devices described herein to the extent that these devices may be used to obtain personally identifiable information data. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device comprising:
an enclosure at least partially defining an internal volume of the electronic device, the enclosure including a cover assembly comprising:
a glass cover member defining:
an exterior surface and an interior surface; and
laser-formed features along the exterior surface and resulting from ablation and flow of the glass cover member, the laser-formed features defining peaks having a mean peak curvature (Ssc) from about 0.1 microns$^{-1}$ to about 1.2 microns$^{-1}$; and
a decorative coating disposed along the interior surface and viewable through the laser-formed features of the glass cover member.

2. The electronic device of claim 1, wherein a root mean square surface slope of the laser-formed features (Sdq) is from about 0.1 to less than about 1.

3. The electronic device of claim 1, wherein a ratio of an amplitude of the laser-formed features to a spacing of the peaks is from about 0.01 to about 0.2.

4. The electronic device of claim 3, wherein:
the amplitude of the laser-formed features is characterized by a root mean square surface height (Sq); and
the spacing of the peaks is characterized by a mean pitch of the peaks.

5. The electronic device of claim 1, wherein an external surface of the cover assembly has a gloss from about 1 to about 10 gloss units as measured at a 60 degree angle.

6. The electronic device of claim 1, wherein the cover assembly further comprises a fluorinated coating disposed on the exterior surface of the glass cover member and having a thickness less than or equal to about 50 nm.

7. An electronic device, comprising:
an enclosure;
a display positioned at least partially within the enclosure;
a first glass cover member coupled to the enclosure and defining a transparent portion positioned over the display; and
a second glass cover member coupled to the enclosure and including a laser-textured surface defining an irregular set of hills and valleys, the irregular set of hills and valleys having:
a mean peak spacing from about 1 micron to about 15 microns; and
a root mean square surface height (Sq) from about 0.1 micron to about 1.5 microns.

8. The electronic device of claim 7, wherein the root mean square surface height is less than or equal to about 1 micron.

9. The electronic device of claim 7, wherein the mean peak spacing is from about 1 micron to about 10 microns.

10. The electronic device of claim 7, wherein:
the second glass cover member is chemically strengthened; and
a compressive stress layer extends from the laser-textured surface into the second glass cover member.

11. The electronic device of claim 7, further comprising an optically dense coating disposed along an interior surface of the second glass cover member.

12. The electronic device of claim 11, wherein:
the electronic device is a mobile phone and further comprises:
a first cover assembly which defines a front side of the mobile phone and includes the first glass cover member; and
a second cover assembly which defines a rear side of the mobile phone and includes the second glass cover member.

* * * * *